(12) United States Patent
Caprara et al.

(10) Patent No.: US 6,285,702 B1
(45) Date of Patent: Sep. 4, 2001

(54) HIGH-POWER EXTERNAL-CAVITY OPTICALLY-PUMPED SEMICONDUCTOR LASER

(75) Inventors: Andrea Caprara, Menlo Park; Juan L. Chilla; Luis A. Spinelli, both of Sunnyvale, all of CA (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 09/263,325

(22) Filed: Mar. 5, 1999

(51) Int. Cl.$^7$ ........................................ H01S 3/08
(52) U.S. Cl. ............................... 372/92; 372/22
(58) Field of Search ..................... 372/36, 22, 99, 372/92

(56) References Cited

U.S. PATENT DOCUMENTS

| | | | |
|---|---|---|---|
| 5,050,179 | 9/1991 | Mooradian | 372/44 |
| 5,131,002 | 7/1992 | Mooradian | 372/50 |
| 5,289,485 | * 2/1994 | Mooradian | 372/45 |
| 5,436,920 | * 7/1995 | Minemoto et al. | 372/92 |
| 5,461,637 | * 10/1995 | Mooradian et al. | 372/92 |
| 5,627,853 | * 5/1997 | Mooradian et al. | 372/92 |

FOREIGN PATENT DOCUMENTS

| | | | |
|---|---|---|---|
| 25 22 338 A1 | 12/1975 | (DE) | H01S/3/10 |
| 42 28 862 | 3/1994 | (DE) | H01S/3/109 |
| 42 28 862 A1 | 3/1994 | (DE) | H01S/3/109 |
| 43 15 580 A1 | 11/1994 | (DE) | H01S/3/043 |
| WO 93/14542 A | 7/1993 | (WO) | H01S/3/109 |
| WO 94/15386 | 7/1994 | (WO) | H01S/3/094 |
| WO 95/25366 | 9/1995 | (WO) | H01S/3/085 |
| WO 95/25366 A | 9/1995 | (WO) | H01S/3/085 |
| WO 98/43329 | 10/1998 | (WO) . | |

OTHER PUBLICATIONS

Kuznetsov, M. et al., "High–Power (>0.5–W CW) Diode–Pumped Vertical–External–Cavity Surface–Emitting Semiconductor Lasers With Circular TEM$_{00}$ Beams," IEEE, Inc., New York, Vp;/ 9, No. 8, pp. 1063–1065, XP000699799, Aug., 1997.

PCT International Search Report, mailed Feb. 25, 2000, for International Appln. No. PCT/US 99/24303, filed Oct. 18, 1999.

Wang–hua Xiang, et al., "Femtosecond external–cavity surface–emitting InGaAs/InP multiple–quantum–well laser," Optics Letters, vol. 16, No. 18, Sep. 15, 1991, pp. 1394–1396.

(List continued on next page.)

Primary Examiner—Leon Scott, Jr.
(74) Attorney, Agent, or Firm—Stallman & Pollock LLP

(57) ABSTRACT

External-cavity optically-pumped semiconductor lasers (OPS-lasers) including an OPS-structure having a mirror-structure surmounted by a surface-emitting, semiconductor multilayer (periodic) gain-structure are disclosed. The gain-structure is pumped by light from diode-lasers. The OPS-lasers can provide fundamental laser output-power of about two Watts (2.0 W) or greater. Intracavity frequency-converted arrangements of the OPS-lasers can provide harmonic laser output-power of about one-hundred milliwatts (100 mW) or greater, even at wavelengths in the ultraviolet region of the electromagnetic spectrum. These high output powers can be provided even in single axial-mode operation. Particular features of the OPS-lasers include a heat sink-assembly for cooling the OPS-structure, a folded resonator concept for providing optimum beam size at optically-nonlinear crystals used for frequency conversion, preferred selection of optically-nonlinear materials for frequency-conversion, and compound resonator designs for amplifying second harmonic-radiation for subsequent conversion to third or fourth harmonic radiation.

44 Claims, 14 Drawing Sheets

OTHER PUBLICATIONS

J.V. Sandusky & S.R.J. Brueck, "A CW External–Cavity Surface–Emitting Laser," *IEEE Photonics Technology Letters*, vol. 8, No. 3, Mar. 1966, pp. 313–315.

A. Rosiewicz, P. Crosby & J–M. Pelaprat, "Optical pumping improves VCSEL performances," *Laser Focus World*, Jun. 1997, pp. 133–136.

W.J. Alford, T.D. Raymond, M.H. Crawford and A.A. Allerman, "Intracavity frequency doubling of an optically–pumped, external–cavity surface–emitting semiconductor laser," Advanced Solid State Laser Conference, Sandia National Laboratories, SAND–98–2108C, CONF–990105, Dec. 31, 1998, 5 pages in length.

M. Kuznetsov, F. Hakimi, R. Sprague & A. Mooradian, "High–Power (>0.5–W CW) Diode–Pumped Vertical–External–Cavity Surface–Emitting Semiconductor lasers with Circular $TEM_{00}$ Beams, " *IEEE Photonics Technology Letters*, vol. 9, No. 8, Aug. 1997, pp. 1063–1065.

\* cited by examiner

HIGH-POWER EXTERNAL-CAVITY OPTICALLY-PUMPED SEMICONDUCTOR LASER

TECHNICAL FIELD OF THE INVENTION

The present invention relates in general to external-cavity optically-pumped semiconductor lasers (hereinafter, OPS-lasers) including a surface-emitting, semiconductor multi-layer (periodic) gain-structure. The invention relates in particular to arrangements of such lasers which can provide fundamental laser output-power of about two Watts (2.0 W) or greater, and intracavity frequency-converted arrangements of such lasers which can provide harmonic laser output-power of about one-hundred milliwatts (100 mW) or greater.

DISCUSSION OF BACKGROUND ART

The term OPS-lasers, as used herein, refers to a class of vertical-cavity surface-emitting semiconductor lasers wherein optical gain is provided by recombination of electrical carriers in very thin layers, for example, about 150 Angstrom units (Å) or less, of a semiconductor material. These layers are generally termed quantum-well (QW) layers or active layers.

In an OPS-laser, several QW layers, for example, about fifteen, are spaced apart by separator layers also of a semiconductor material, but having a higher conduction band energy that the QW layers. This combination of active layers and separator layers may be defined as the gain-structure of the OPS-laser. The layers of the gain-structure are epitaxially grown. On the gain-structure is an epitaxially-grown multilayer mirror-structure, often referred to as a Bragg mirror. The combination of mirror-structure and gain-structure is referred to hereinafter as an OPS-structure.

In an (external cavity) OPS-laser, another (conventional) mirror, serving as an output-coupling mirror is spaced-apart from the OPS-structure, thereby forming a resonant cavity with the mirror-structure of the OPS-structure. The resonant cavity, accordingly, includes the gain-structure of the OPS-structure. The mirror-structure and gain-structure are arranged such that QW layers of the gain-structure are spaced apart by one half-wavelength of the fundamental laser wavelength, and correspond in position with antinodes of a standing-wave of the fundamental laser-radiation in the resonator. The fundamental-wavelength is characteristic of the composition of the QW layers.

Optical pump-radiation (pump-light) is directed into the gain-structure of the OPS-structure and is absorbed by the separator layers of the gain-structure, thereby generating electrical-carriers. The electrical-carriers are trapped in the QW layers of the gain-structure and recombine. Recombination of the electrical-carriers in the QW layers yields electromagnetic radiation of the fundamental-wavelength. This radiation circulates in the resonator and is amplified by the gain-structure thereby generating laser-radiation.

OPS-lasers have often been used in the prior art as a means of conveniently testing QW structures for later use in electrically-pumped semiconductor lasers. More recently, OPS-lasers have been investigated as laser-radiation sources in their own right. The emphasis of such investigation, however, appears to be on providing a compact, even monolithic, device in keeping with the generally compact nature of semiconductor lasers and packaged arrays thereof. The gain-structure of OPS-structures may be formed from the same wide range of semiconductor-materials/substrate combinations contemplated for diode-lasers. These include, but are not limited to, InGaAsP/InP InGaAs/GaAs, AlGaAs/GaAs, InGaAsP/GaAs and InGaN/Al$_2$O$_3$, which provide relatively-broad spectra of fundamental-wavelengths in ranges, respectively, of about 960 to 1800 nanometers (nm); 850 to 1100 nm; 700 to 850 nm; 620 to 700 nm; and 425 to 550 nm. There is, of course, some overlap in the ranges. Frequency-multiplication of these fundamental-wavelengths, to the extent that it is practical, could thus provide relatively-broad spectra of radiation ranging from the yellow-green portion of the electromagnetic spectrum well into the ultraviolet portion.

In conventional solid-state lasers, fundamental-wavelengths, and, accordingly, harmonics thereof (produced by frequency-doubling or frequency-mixing) are limited to certain fixed wavelengths characteristic of a particular dopant in a particular crystalline or glassy host, for example, the well-known 1064 nm wavelength of neodymium-doped yttrium aluminum garnet (Nd:YAG). While one of these characteristic wavelengths may be adequate for a particular application, it may not be the optimum wavelength for that application.

OPS-lasers provide a means of generating wavelengths, in a true CW mode of operation, which can closely match the optimum wavelength for many laser applications, in fields such as medicine, optical metrology, optical lithography, and precision laser machining. Prior-art OPS-lasers, however, fall far short of providing adequate power for such applications. It is believed that the highest fundamental output-power that has been reported, to date, for an OPS-laser is 700 mW at a wavelength of about 1000 nm (Kuznetsov, et al., IEEE Photonics Tech. Lett 9 1063 (1997)). For an intracavity frequency-doubled OPS-laser, it is believed that highest output-power that has been reported is 6 mW at a wavelength of about 488 nm (Alford et al. Technical Digest of the IEEE/OSA Conference on Advanced Solid State Lasers, Boston Mass., Feb. 1–3 1999, pp 182–184). It believed that there has been no report to date of generation of continuous wave (CW) ultraviolet (UV) radiation in an OPS-laser, either directly or by frequency-multiplication.

However flexible an OPS-laser may be in potentially offering a wide selection of wavelengths, in order to be competitive in applications in which solid-state and other lasers are currently used, at least an order-of-magnitude, and preferably two orders-of-magnitude increase in power over that offered by prior-art OPS-lasers is required. This power increase must also be achieved without sacrifice of output-power stability and beam-quality. Further, in order to be applicable in the broadest range of applications the range of OPS-laser wavelengths available at high-power and with high beam-quality must be extended into the UV region of the electromagnetic spectrum, preferably to wavelengths less than 300 nm.

SUMMARY OF THE INVENTION

The present invention is directed to providing high-power OPS-lasers, including high-power OPS-lasers providing ultraviolet radiation, i.e., at wavelengths less than about 425 nm. In one particular aspect, an OPS-laser in accordance with the present invention comprises an OPS-structure having a gain-structure surmounting a mirror-structure. The gain-structure includes a plurality of active layers having pump-light-absorbing layers therebetween. The active layers have a composition selected to provide emission of electromagnetic radiation at a predetermined fundamental-wavelength between about 425 nanometers and 1800 nanometers when optical-pump light is incident on the gain-structure. The mirror-structure includes a plurality of layers of alternating high and low refractive index and having an optical thickness of about one-quarter wavelength of the predetermined wavelength.

A laser-resonator is formed between the mirror-structure of the OPS-structure and a reflector spaced apart therefrom. An optical arrangement is provided for delivering the pump-light to the gain-structure, thereby causing fundamental laser-radiation having the fundamental wavelength to oscillate in the laser-resonator. A heat-sink arrangement is provided for cooling the OPS-structure. An optically-nonlinear crystal is located in the laser-resonator and arranged for frequency-doubling the fundamental laser-radiation, thereby providing frequency-doubled radiation having a wavelength half of the fundamental wavelength.

The laser-resonator, the optically nonlinear-crystal, the OPS-structure, the heat-sink arrangement and the optical pump-light-delivering arrangement are selected and arranged such that the resonator delivers the frequency-doubled radiation as output-radiation having a wavelength between about 212 nanometers and 900 nanometers at an output-power greater than about 100 milliwatts. The laser preferably has a resonator length greater than about 5.0 cm In one embodiment of a high-power OPS-laser in accordance with the present invention, stable, single axial-mode, CW laser output-power of about 4.0 W at 488 nm wavelength is achieved by intracavity frequency-doubling 976 nm radiation from a single OPS-structure using an optically-nonlinear crystal of lithium triborate (LBO) in a resonator having a length of about twenty-five centimeters (cm). The OPS-structure has active layers of an $In_{0.18}Ga_{0.82}As$ composition, and pump-light-absorbing (separator) layers of a $GaAs_{0.978}P_{0.022}$ composition. The laser is pumped by about 34.0 W of 808 nm radiation from two diode-laser arrays. Numerical models indicate that the same resonator may be modified by including an optically-nonlinear crystal for mixing the fundamental and frequency-doubled radiation to produce about 120.0 mW of (frequency tripled or third-harmonic) 325 nm UV radiation. A simplified configuration of the resonator of this example was used without an optically nonlinear crystal to deliver fundamental output-power of about 10 W.

The 4.0 W of frequency-doubled output-power represents over two orders-of-magnitude increase over what is believed to be the highest reported frequency-doubled output-power of any prior-art OPS-laser. It is believed that frequency-tripled output of any power has not been achieved in a prior-art OPS-laser.

Numerical models indicate that in a resonator similar to the resonator of the example above, an OPS-structure having a gain-structure $In_xGa_{1-x}P$ quantum wells with $In_yGa_{1-y}As_zP_{1-z}$ separator layers therebetween, wherein x is selected to provide fundamental radiation at 750 nm may be pumped by 12.0 Watts of pump-light at 670 nm, using a 5 mm-long LBO crystal for frequency doubling to provide output-power in excess of 1 Watt at the frequency-doubled wavelength of 375 nm.

This remarkable increase in OPS-laser output-power and the ability to generate high, CW, UV output-power, either by frequency-doubling or frequency-tripling, is achieved without sacrifice of beam-quality. Single mode operation provides that OPS-lasers in accordance with the present invention can have a beam quality less than 2.0 times, and as low as 1.2 times the diffraction limit. This high-beam quality makes the inventive OPS-lasers ideal for applications in which the output radiation must be focused to a very small spot for making precise incisions in inorganic or organic material, or must be efficiently coupled into an optical fiber for transport to a location where it is to be used.

In another aspect of an OPS-laser in accordance with the present invention, the laser includes first and second resonators arranged such that a portion of the resonator axes of each are on a coaxial path. The first resonator includes an OPS-structure arranged outside the coaxial path to provide a selected fundamental-wavelength of laser radiation. Located on the coaxial path of the first and second resonators is an optically-nonlinear crystal arranged for frequency-doubling the fundamental radiation. The first and second resonators are interferometrically matched to maintain optimum phase-matching between fundamental and frequency-doubled radiation in the optically-nonlinear crystal. Fundamental-wavelength radiation and frequency-doubled radiation circulate together only along the coaxial path. An optically-nonlinear crystal is located in the second resonator outside the coaxial path for doubling the frequency of the frequency-doubled radiation thereby providing frequency-quadrupled radiation. Numerical models indicate that by using the 976 nm OPS-structure and pumping arrangement of the above-described first embodiment, this second embodiment is capable of providing about 2.0 W of frequency-quadrupled (244 nm) radiation.

In yet another aspect of an OPS-laser in accordance with the present invention, the laser includes first and second interferometrically-matched resonators arranged such that a portion of the resonator axes are on a coaxial path. The coaxial path includes a first optically-nonlinear crystal arranged for frequency-doubling as discussed above with respect to the second embodiment. Fundamental-wavelength radiation and frequency-doubled radiation circulate together only along the coaxial path. A second optically-nonlinear crystal is located in the coaxial path of the first and second resonators for mixing the fundamental radiation with frequency-doubled radiation thereby providing frequency-tripled radiation. Numerical models indicate that by using the 976 nm OPS-structure and pumping arrangement of the above-described first embodiment, this third embodiment is capable of providing about 4.0 W of frequency-tripled (325 nm) radiation.

Other, more general, aspects of OPS-lasers in accordance with the present invention include but are not limited to: design of heat-sink configurations and bonding methods for cooling an OPS-structure which allow the above exemplified high pump-powers to be directed on the OPS-structure while maintaining a safe operating temperature therefor; design of optically-long resonators for providing a relatively large fundamental mode-size at OPS-structure to take advantage of a larger pumped-area, thereby increasing laser output-power; design of specific, folded-resonator configurations for optimizing output of frequency-converted radiation and preventing reflection of the frequency-converted radiation back into the OPS-structure where it would be lost through absorption; selection of a specific ratio of pumped area to mode-size at the OPS to optimize use of gain, and to prevent generation of transverse modes of oscillation; use of an intracavity wavelength-selective element for preventing oscillation of fundamental radiation at wavelengths outside the spectral range of acceptance of optically nonlinear crystals; selection of optically nonlinear materials for maximum spectral acceptance to allow the use of efficient and tolerant wavelength-selective devices for the former; configuration of OPS-structures to eliminate parasitic lateral oscillation which would otherwise reduce output power;

design of OPS-structures for minimum net stress and reliability under high power operation; use of radial-index gradient lens to optimize multiple optical-fiber delivery of pump-light; and design of mirror-structures for the inventive OPS-structure for maximum thermal-conductivity thereby facilitating cooling of the OPS-structures.

It will be particularly evident from the detailed description of the present invention presented below that for achieving the high powers discussed above, OPS-laser resonators in accordance with the present invention depart radically from the "compactness" philosophy of prior-art OPS-lasers and are inventively configured for intracavity frequency multiplication. It will also be evident that significant attention is directed to thermal management of OPS-structures, to the design of OPS-structures themselves, and to selection of frequency multiplication materials, in order to achieve the remarkable output-power levels, and stability of the inventive OPS-lasers. It will further be evident that certain inventive aspects of the invention are applicable to both high and low-power OPS-lasers, or even to laser types other than OPS-lasers.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the invention.

DETAILED DESCRIPTION OF THE INVENTION

Figure 1:
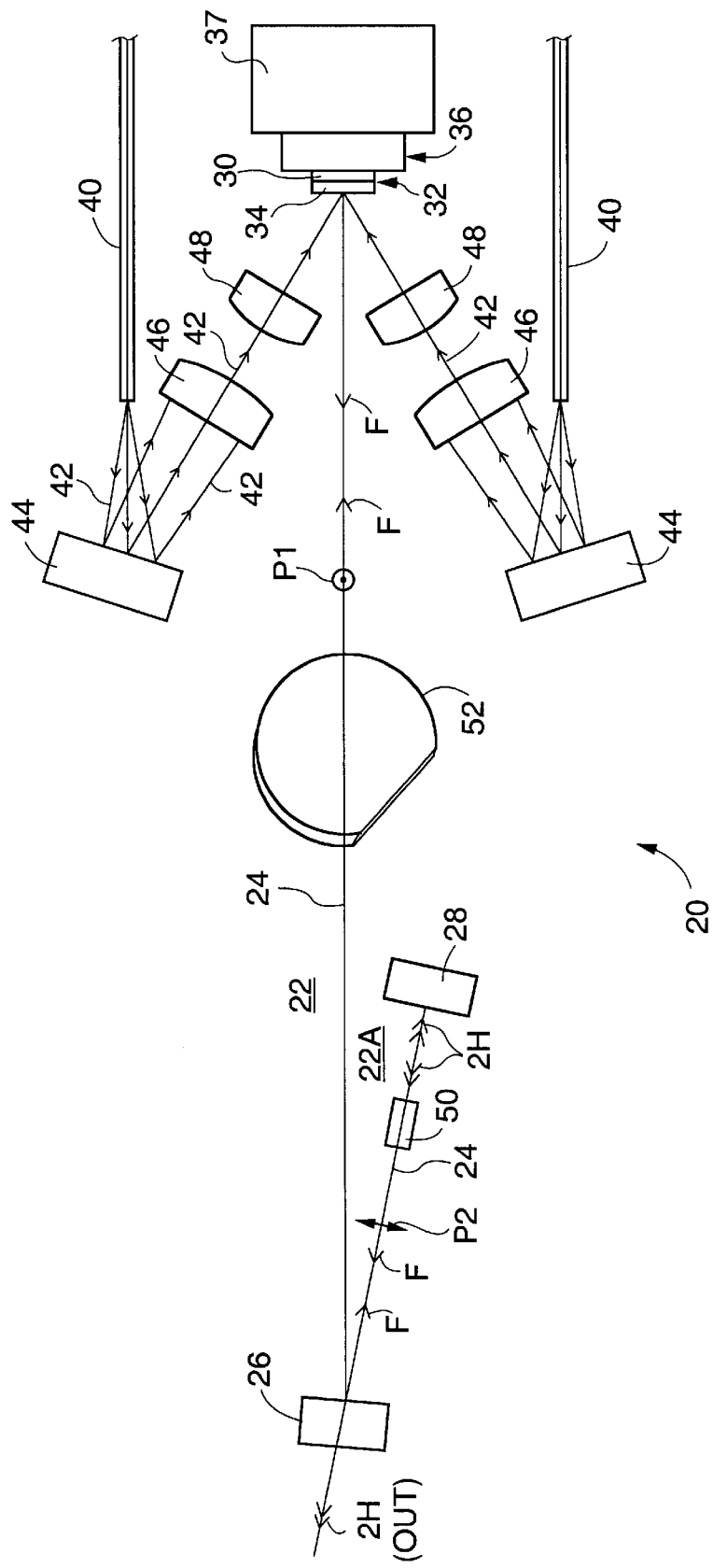
FIG. 1 schematically illustrates a preferred embodiment of an OPS-laser in accordance with the present invention having a resonator including an OPS-structure and an optically-nonlinear crystal arranged for intracavity frequency-doubling the fundamental-wavelength of the OPS-structure.

Turning now to the drawings, wherein like components are designated by like reference numerals. FIG. 1 schematically illustrates an OPS-laser 20 in accordance with the present invention. Laser 20 includes a resonator 22 having a longitudinal axis 24 thereof folded by a fold-mirror 26. Resonator 22 is terminated at one end thereof by a flat mirror or reflector 28, and at the other end thereof by a mirror portion (mirror-structure) 30 of an OPS-structure 32. A gain portion (gain-structure) 34 of OPS-structure 32 is thus located in the resonator in contact with a resonator mirror, i.e., mirror-structure 30.

Gain-structure 34 of OPS-structure 32 is an epitaxially-grown monolithic semiconductor (surface-emitting) multi-layer structure including a plurality of active layers (not shown in FIG. 1) spaced apart by pump-light-absorbing separator-layers (also not shown in FIG. 1). It should be noted here that the terminology "spaced apart by pump-light-absorbing separator layers" in the context of this description and the appended claims does not preclude there being other layers between the QW layers. Depending on the composition of the QW layers, one or more other layers may be included for strain-management, carrier-confinement and the like. Any such arrangement is applicable in the context of the present invention.

In prior-art OPS-lasers, the mirror-structure of the OPS-structure is typically also an epitaxially-grown multilayer structure grown from different compositions of material having a general composition $Al_xGa_{(1-x)}As$ (abbreviated AlGaAs), wherein increasing x increases the bandgap of the material, and lowers the refractive index. While this is one form of mirror-structure which could be used for mirror-structure 30, it is neither the only form contemplated, nor the preferred form contemplated. Mirror-structure 30 in an OPS-structure 32 in accordance with the present invention, need not be epitaxially grown and may include dielectric or metal layers. If epitaxially grown, it need not be formed entirely from materials in the (ternary) AlGaAs system. Preferred mirror-structures are discussed in detail further hereinbelow.

Continuing now with reference to FIG. 1, OPS-structure 32 is bonded in thermal contact with a heat-sink 36. Heat-sink 36 is preferably an actively-cooled heat-sink such as a microchannel-cooler. A particularly preferred arrangement of heat sink 36 is discussed in detail further hereinbelow.

OPS-structure 32 is optically pumped, preferably, by pump-light delivered from one or more diode-laser arrays (not shown). In FIG. 1, pump-light is delivered from two diode-laser arrays via two optical fibers (or fiber bundles) 40. Pump-light 42 diverges as it exits a fiber 40. In each case, the diverging pump-light is directed by a mirror 44, through focusing lenses 46 and 48, to be focused (only an axial ray shown) on gain-structure 34 of OPS-structure 32. It should be noted, that while two pump-light-delivery fibers 40 and associated focussing optics are illustrated in FIG. 1, this should not be considered as limiting the present invention. Only one, or more than two pump-light-delivery fibers and associated focusing-optics may be used, and even different pump-light sources with or without fiber delivery may be used, without departing from the spirit and scope of the present invention. Further it should be noted that optical fibers and fiber bundles are just one preferred means of transporting pump-light from a source thereof. Other forms of what may be generally termed "a lightguide", for example, solid or hollow light-waveguides maybe used without departing from the spirit and scope of the present invention.

Mirrors 26 and 28, and mirror-structure 30 of OPS-structure 32, each have maximum reflectivity at a fundamental (emission) wavelength characteristic of the composition of (active layers of) gain-structure 34 of OPS-structure 32. Energizing gain-structure 34 of OPS-structure 32 causes laser radiation having the fundamental-wavelength (fundamental-radiation) to circulate in resonator 22. This fundamental-radiation is indicated in FIG. 1 by single arrows F.

Included in resonator 22, in folded portion 22A thereof, proximate, but spaced apart from mirror 28, is an optically-nonlinear crystal 50 arranged for frequency-doubling (halving the wavelength of) the fundamental radiation. This generates frequency-doubled or second-harmonic (2H) radiation indicated in FIG. 1 by double arrows 2H. 2H-radiation is generated both on a first pass of fundamental laser radiation therethrough and on a return pass of the fundamental-radiation after it is reflected from mirror 28. Fold-mirror 26 is transparent to the 2H-radiation and, accordingly, serves to couple the 2H-radiation out of resonator 22.

Figure 2:
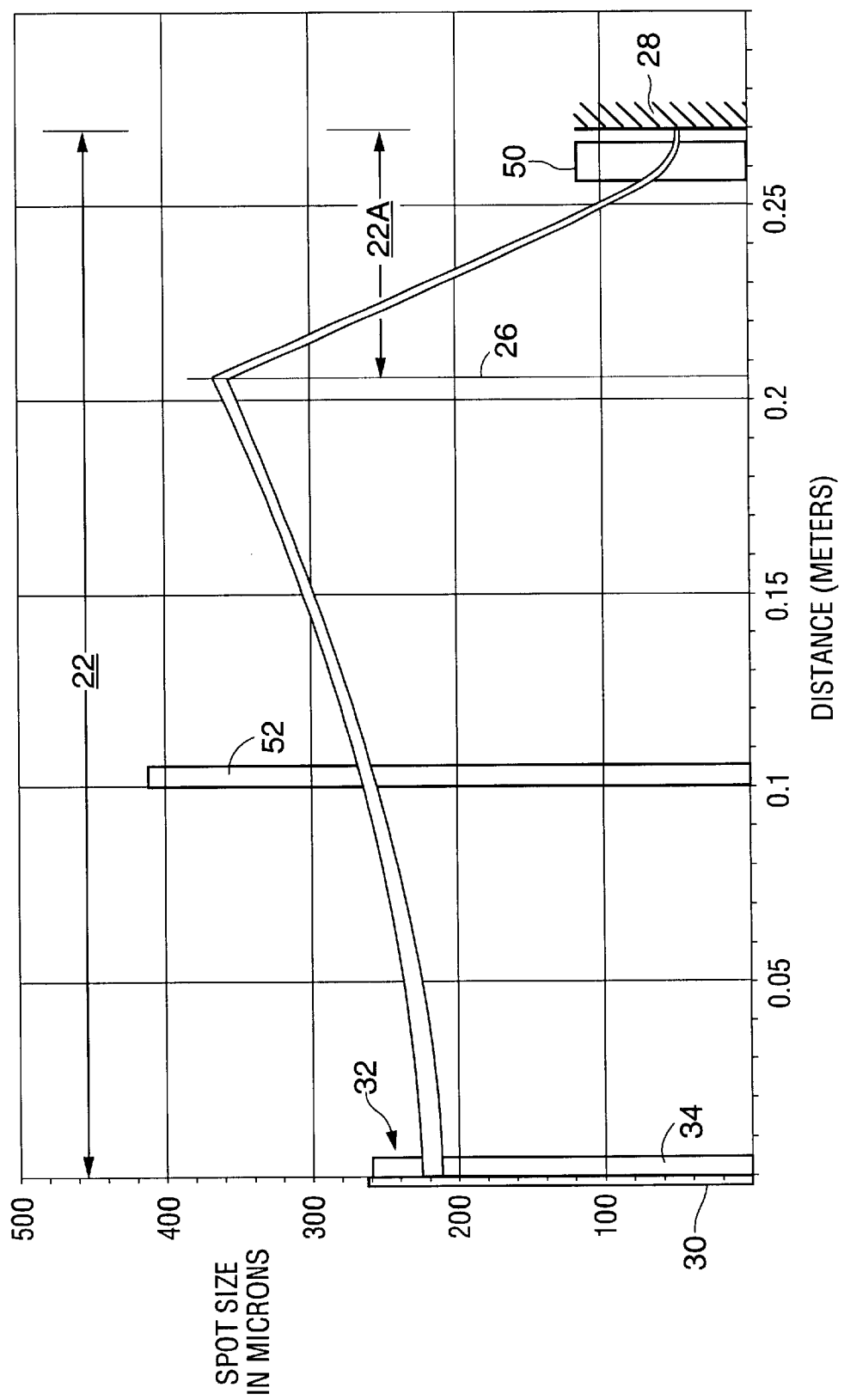
FIG. 2 is a graphical representation of the mode-size of fundamental radiation as function of axial position in the resonator of FIG. 1

It should be noted here, that this folded-resonator arrangement of an OPS-laser in accordance with the present invention is particularly important, considering the high-power operation of the device. The folded-resonator arrangement allows formation a resonating beam in resonator 22 having optimum characteristics at OPS-structure 32 and at the optically-nonlinear crystal 50. In one arrangement the pump-light spot-size at OPS-structure 32 preferably has a gaussian shape, preferably with a $1/e^2$ radius of about 230 micrometers ($\mu$m). In order to maximize overlap and obtain optimum power-extraction in fundamental transverse mode, the resonating fundamental-radiation at OPS-structure 32 preferably has a similar size of 230 $\mu$m ($1/e^2$ radius). Extensive numerical simulations, corroborated by experimental results, indicate that the spot-size of fundamental-radiation in optically-nonlinear crystal 50 is preferably of the order of 50 $\mu$m ($1/e^2$ radius) for optimum second harmonic generation. FIG. 2 depicts mode-size (radius) as a function of axial position within resonator 22 of laser 20. of FIG. 1. It can be seen that this preferred resonator arrangement of plane end mirrors (mirror-structure 30 and external mirror 28) folded by a concave fold-mirror 26 (here, having a radius of 100 mm), provides above-discussed preferred spot or mode-sizes at OPS-structure 32 and in optically-nonlinear crystal 50. The folded-resonator arrangement, as noted above, also allows two passes of fundamental radiation through optically-nonlinear crystal 50, thereby increasing the amount of 2H-radiation generated. Extraction of the 2H-radiation via fold-mirror 36 prevents 2H-radiation from being lost by absorption in OPS-structure 32.

In an intracavity frequency-doubled laser in accordance with the present invention, it is preferable to include a wavelength-selective element, such as a birefringent filter or an etalon in the resonator for forcing the resonator to oscillate precisely at the wavelength that the optically-nonlinear crystal is arranged to frequency-double. This is discussed in detail further hereinbelow with respect to selection of a preferred material for optically-nonlinear crystal 50. In laser 20, such a wavelength-selective element is depicted in the form of a birefringent filter 52 arranged at Brewster's angle (here 57.1°) to axis 24 of resonator 20. It is emphasized here that the purpose of this wavelength-selective element is not axial-mode selection, as this is accomplished by a combination of the unique properties of OPS-structure 32 combined with its location in resonator 22. Rather, birefringent filter 52 is used to effectively spectrally narrow the gain-bandwidth of gain-structure 34 of OPS-structure 32 to a bandwidth narrower than a spectral acceptance region over which the optically-nonlinear crystal 50 is effective. This prevents laser 20 from oscillating at wavelengths where the optically-nonlinear crystal is ineffective. This aspect of OPS-lasers in accordance with the present invention is also discussed in detail further hereinbelow.

Figure 3:
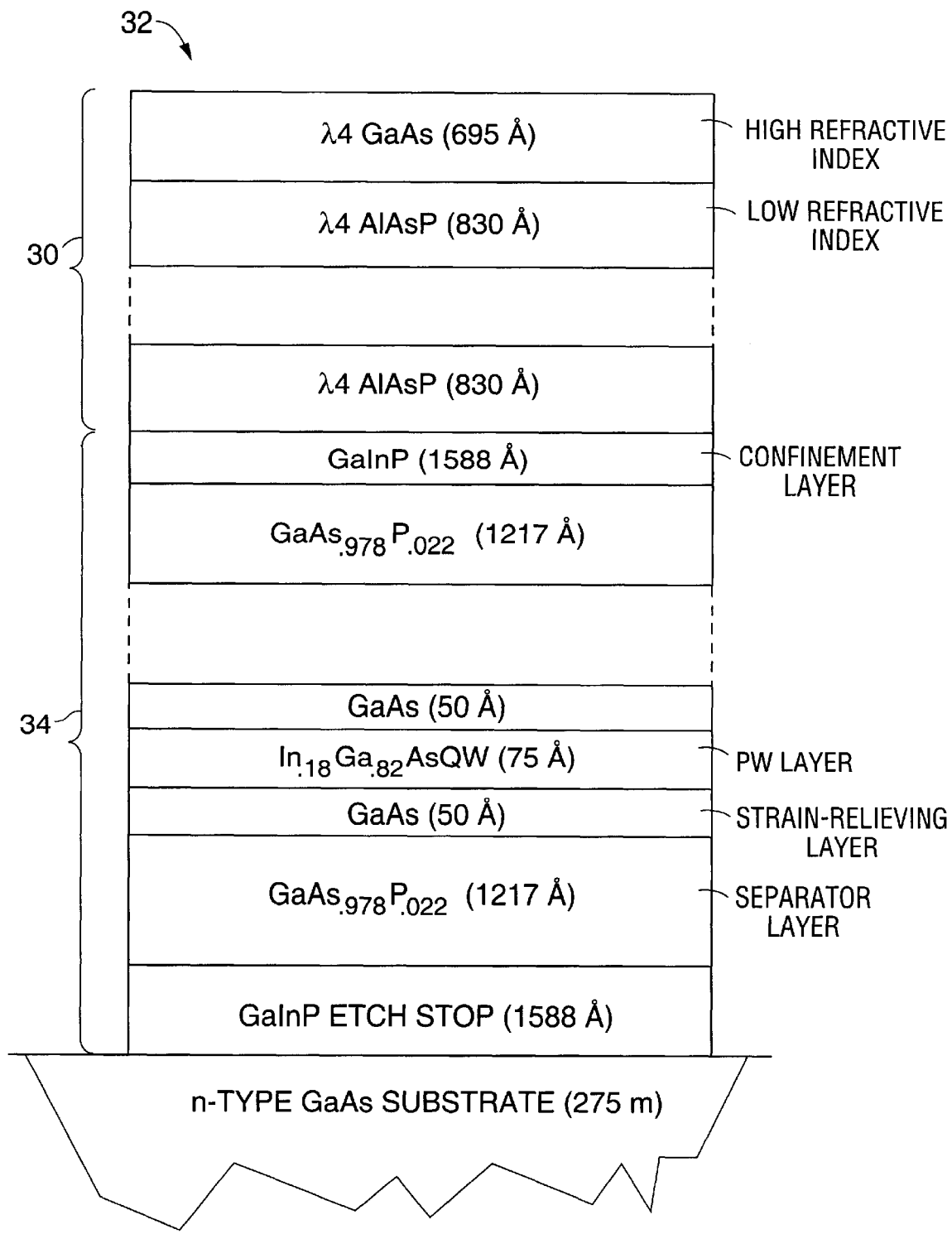
FIG. 3 schematically illustrates details of one preferred arrangement and composition of semiconductor layers in the OPS-structure of FIG. 1.

In one example of a laser 20 in accordance with the arrangement of FIG. 1, OPS-structure 32 (see FIG. 3) has a gain-structure 34 comprising fifteen QW or active-layers of an $In_{0.18}Ga_{0.82}As$ composition, having a thickness of about 75.0 Angstrom Units (Å) providing a nominal fundamental (emission) wavelength of 976 nm. Between the QW layers are pump-light-absorbing (separator) layers of a $GaAs_{0.978}P_{0.022}$ composition having a thickness of 1217 Å. Between the QW layers and the separator layers is a strain-relieving layer of GaAs having a thickness of about 50 Å. Mirror-structure 30 comprises 27 pairs or periods of alternating layers of GaAs having a refractive index of about 3.51 and $AlAs_{0.96}P_{0.04}$ having a refractive index of about 2.94 and an optical thickness of one-quarter wavelength at the fundamental-wavelength. Gain-structure 34 also includes a carrier-confinement layer of $Ga_{0.51}In_{0.49}P$, having a thickness of 1588 Å, between the last separator layer and mirror-structure 30. At an opposite extremity of gain-structure 34 there is also a carrier-confinement layer of $Ga_{0.51}In_{0.49}P$ having a thickness of 1588 Å.

OPS-structure 32 is epitaxially grown on an n-type GaAs wafer (substrate), gain-structure 34 being grown first, beginning with the carrier confinement layer. Mirror-structure 30 is epitaxially-grown on the gain-structure. After the OPS-structure is grown, the wafer is etched away. The first-grown confinement layer serves as an etch-stop layer when the substrate is removed by etching. The wafer, and structures grown thereon, is diced into several OPS-structures 32 in the form of square "chips" about 2.0 mm by 2.0 mm.

An OPS-structure (chip) is first bonded to a microchannel-cooler (cooler 36). One preferred microchannel-cooler is a Model SA-2, available from Saddleback Aerospace Corporation of Los Alamitos, Calif. Before bonding the OPS-structure to the microchannel-cooler, a relatively thin (about 0.3 mm thick) synthetic diamond (CVD-diamond) layer, is bonded to the microchannel-cooler. The synthetic diamond layer has a particular thermal-management function which is discussed in further detail hereinbelow.

In prior-art methods for bonding to diamond a gold overcoated platinum metalization is applied to the diamond before bonding. Indium is solder used for bonding. Under the operating conditions contemplated for a bonded OPS-structure in accordance with the present invention, the gold overcoating can dissolve in the indium bonding material, eventually causing long-term instability of the bonded joint, with an associated deformation of the OPS structure. One preferred bonding method in accordance with the present invention which is believed may provide superior long-term stability and avoid potential deformation is to provide metalization on the diamond comprising a titanium layer overcoated by a platinum layer only without a gold overcoating. Bonding is then performed using indium solder. It is believed that such a bonding method would be superior to prior-art chip-bonding methods, not only under the high-power operating conditions contemplated for OPS-lasers in accordance with the present invention but for any OPS-laser.

Another possible bonding method would be to use a more stable, gold-tin eutectic solder rather than indium solder. It is possible, here, however, that a coefficient of thermal expansion (CTE) mismatch with diamond may limit its use with diamond heat-sinks. The CTE mismatch problem may be avoided by use of alternate heat-sink materials having a closer CTE match to the gold-tin eutectic, such as copper-tungsten (Cu-W), cubic boron nitride, silicon-diamond composite, and the like. Some compromise in output-power performance may be expected here, however, due to the lesser heat conduction efficiency of these materials compared to diamond. The CTE mismatch problem becomes greater the larger the chip.

After the OPS-structure is bonded to the diamond-layer/microchannel-cooler, the GaAs substrate is removed by etching. Preferably, an antireflection coating is deposited on thus-exposed gain-structure 34 to improve entry of pump-light into the gain-structure.

Regarding optical pumping of OPS-structure 32, each fiber 40 delivers about 17.0 W of 795 nm radiation from a FAP-30C-800-B diode-laser-array package available from Coherent Semiconductor Group of Santa Clara, Calif. Mirrors 44 are dielectric-coated mirrors having greater than 99.9% reflectivity at 795 nm and 28° angle of incidence. Lenses 46 are cemented doublets having a focal length of 40.0 mm and a diameter of 18.0 mm. Lenses 48 are cemented doublets having a focal length of 21.0 mm and a diameter of 14 mm. These lenses are available from Melles Griot of Irvine, Calif. The pump-light is focused by the mirrors and lenses into an area of OPS-structure. A total of 34 Watts of pump-light in the pumped area has a substantially Gaussian intensity profile with a radius of about 260 $\mu$m at the $1/e^2$ points. The exemplified diode-laser-array packages providing the pump-light require about 50.0 Watts each of so-called "wallplug" electrical-power input generate 20.0 Watts of pump radiation coupled into transport fibers 40.

Birefringent filter 52 is quartz plate having a thickness of 3.08 mm and oriented as depicted in FIG. 1 at 57.1 degrees to axis 24, with the quartz optical axis in the plane of the plate. Such a filter is available as Part No. BF254-6T from VLOC Company of Port Richey, Fla. This orientation of birefringent filter 52 provides that fundamental radiation F is polarized perpendicular to the plane of FIG. 1 as illustrated by arrow P1.

Birefringent filter 52 has narrow transmission-peaks separated by about 35 nm, each with a full width at half maximum transmission (FWHM) of about 3 nm. Maximum selectivity is achieved by keeping the quartz optic-axis at an angle of about 45 degrees from an axis defined by the intersection of the vertical plane with the plane of the plate. The wavelength of the transmission peaks can be shifted by rotating the plate slightly around an axis normal to its faces, thus achieving tuning of the filter. The computed tuning rate, confirmed experimentally, is about 5.6 nm per degree of rotation.

Mirror 28 is a plane mirror and fold-mirror 26 is a concave mirror having a radius of curvature of 100 mm. Mirrors 26 and 30 are axially separated by a distance of 202 mm. Mirrors 26 and 28 are axially separated by a distance of 56 mm. Accordingly, resonator 22 has an axial length of 258 mm (25.8 cm).

Optically nonlinear crystal 50 is a 5 mm-long crystal of lithium triborate (LBO) having a cross-section of 3 mm×3 mm. The crystal is cut for type-1 phase matching for 976 nm radiation. Propagation of the fundamental beam is in the crystallographic X-Y plane. The propagation direction is at an angle of 17.1 degrees from the X-axis. The fundamental-radiation is polarized perpendicular to the X-Y plane (parallel to the Z-axis). Second-harmonic radiation is polarized in the X-Y plane, as illustrated by arrow P2.

The above-specified exemplary OPS-laser generated an intracavity power of fundamental (976 nm) radiation of about 300 watts yielding frequency-doubled (488 nm) radiation at an output power of 5 Watts in single longitudinal (axial) mode and single transverse mode. The beam divergence was measured at 1.2 times the diffraction limit ($M^2$= 1.2). The quantity $M^2$ is a numerical measure which represents a ratio of the size of the beam to a diffraction-limited size. A high quality beam may be regarded as a beam having an $M^2$ of about 2.0 or less. The high-beam quality available with the inventive OPS-lasers make them useful for applications in which the laser output-radiation must be focused to a very small spot for making precise incisions in inorganic or organic material, or must be efficiently coupled into an optical-fiber or guided by an articulated arm for transport to a location where it is to be used.

From the power point-of-view alone, this represents about a one-thousand-fold increase over the above-discussed 6.0 mW output of a prior-art IC, frequency-doubled OPS-laser. Surprisingly, the fundamental radiation, and, accordingly, the frequency-doubled radiation was in a single axial (longitudinal) mode. Temporal stability of the output-radiation is estimated in terms of output-fluctuation or noise of less than about 0.05% RMS over a band DC to 10 MHz. It is believed that in other embodiments OPS-lasers in accordance with the present invention described hereinbelow a noise of less than about 0.1% can be obtained. Pump-light to second-harmonic efficiency is about ten percent. Electrical to second-harmonic efficiency is about four percent. Generally, a pump-light to second-harmonic efficiency of 3.0 percent or greater may be achieved in appropriate embodiments of inventive OPS-lasers discussed herein.

Detuning of the cavity (moving mirror 28 axially away from fold-mirror 36) to reduce the beam spot-size at OPS-structure 32, forced operation in multiple transverse mode, allowed obtaining up to 7.5 Watts of output-power at 488 nm, thereby obtaining even higher power and efficiency at the expense of a reduced beam-quality due to the multiple mode operation. The relationship of mode-size to pumped-area (pump-spot size) in connection with ensuring single axial-mode operation is discussed in detail further hereinbelow.

The high output-power at 488 nm of the inventive IC double OPS-laser is obtained with a total input electrical-power to the pump-light-providing diodes of about 100 Watts. In prior-art lasers, multi-Watt, high-beam-quality radiation at 488 nm was only obtainable as the output of argon ion (gas) lasers. These lasers typically require several thousands of Watts (up to 30 Kilowatts) of electrical-power input. Accordingly, the above-exemplified laser in accordance with the present invention provides an improvement in the "electrical-to-optical" efficiency of two orders of magnitude for 488 nm lasers.

Continuing now with the description of preferred embodiments of OPS-lasers in accordance with the present invention, an important aspect of the above-discussed example of an OPS-laser is the discovery that such a high-fundamental power can be generated from an OPS-structure, by paying attention, inter alia, to thermal management of the intensely-pumped OPS-structure in combination with increasing the dimensions of the resonator well beyond those of prior-art OPS-lasers.

Having established experimentally that such a high fundamental and 2H-power can be provided, it is possible to numerically-model other inventive OPS-lasers based on the same or different OPS-structures 32 and "long resonator" arrangements, similar to that of laser 20, which generate other fundamental and 2H wavelengths at similar output power.

In particular, high-power CW radiation in the ultraviolet spectral region, for example, at about 375 nm, can be generated by using an OPS-structure 32 having a gain-structure 34 having $In_xGa_{1-x}P$ quantum wells with $In_yGa_{1-y}As_zP_{1-z}$ separator layers therebetween. Such an OPS-structure, pumped with 670 nm radiation from fiber-coupled diode-lasers (for example, SDL part number 7470 P-5 from SDL,Inc., of San Jose, Calif.) provides gain at 750 nm. A resonator similar to resonator 22 of FIG. 1 may be used, with a similar birefringent filter 52, suitably angle-tuned, and with an optically-nonlinear crystal 50 of LBO arranged for frequency doubling the 750 nm radiation.

In this regard, the LBO crystal is preferably cut for propagation in the X-Y crystallographic plane, at an angle of 37.5 degrees from the X-axis. The polarizations of the fundamental and 2H-radiation are the same as for the (976 nm fundamental-wavelength) laser 20 exemplified above. The efficiency of conversion for 750 nm radiation for the LBO crystal is computed to be slightly higher (17% higher) than the efficiency of conversion for 976 nm radiation for equal lengths of the optically-nonlinear crystal. This results from a balancing of two opposing factors. The effective nonlinearity (nonlinear-coefficient) of LBO at 750 nm is lower, at about 1.0 picometer per volt (pm/V) compared with a value of 1.2 pm/V at 975 nm, due to the different angle of propagation. The overall conversion-efficiency, however, is proportional to the square of the nonlinear-coefficient, but is also proportional to the inverse of the square of the wavelength. Accordingly, the shorter wavelength (750 nm), is instrumental in providing the above-discussed improvement of the overall conversion-efficiency.

In one numerically-simulated example of a frequency-doubled, 750 nm fundamental-wavelength laser 20, 12.0 Watts of pump-light at 670 nm, obtained from 4 fiber-coupled diode-laser arrays or modules, using a 5 mm-long LBO crystal for optically-nonlinear crystal 20, resulted in computed output-power in excess of 1 Watt at the 2H-wavelength of 375 nm. Using higher pump-power from more the same number of more-powerful diode-laser arrays, or from more arrays of the same power, can provide 375 nm output-power comparable to the 488 nm output power exemplified above for the same resonator. Use of more pump-light arrays is possible using an alternative pump-light delivery arrangement discussed in detail further hereinbelow.

Having established experimentally, and numerically corroborated, that such a high fundamental power can be generated, it is possible to configure other "long-resonator" type, inventive OPS-lasers based on the same OPS-structures, for generating third harmonic (3H) and fourth harmonic (4H) radiation, and to compute, with confidence, what output-power can be generated at such third and fourth harmonic-wavelengths in the UV region of the electromagnetic spectrum. Descriptions of such resonator configurations are set forth below, exemplifying generation of the third harmonic of 750 nm radiation, and the fourth harmonic of 976 nm radiation.

Figure 4:
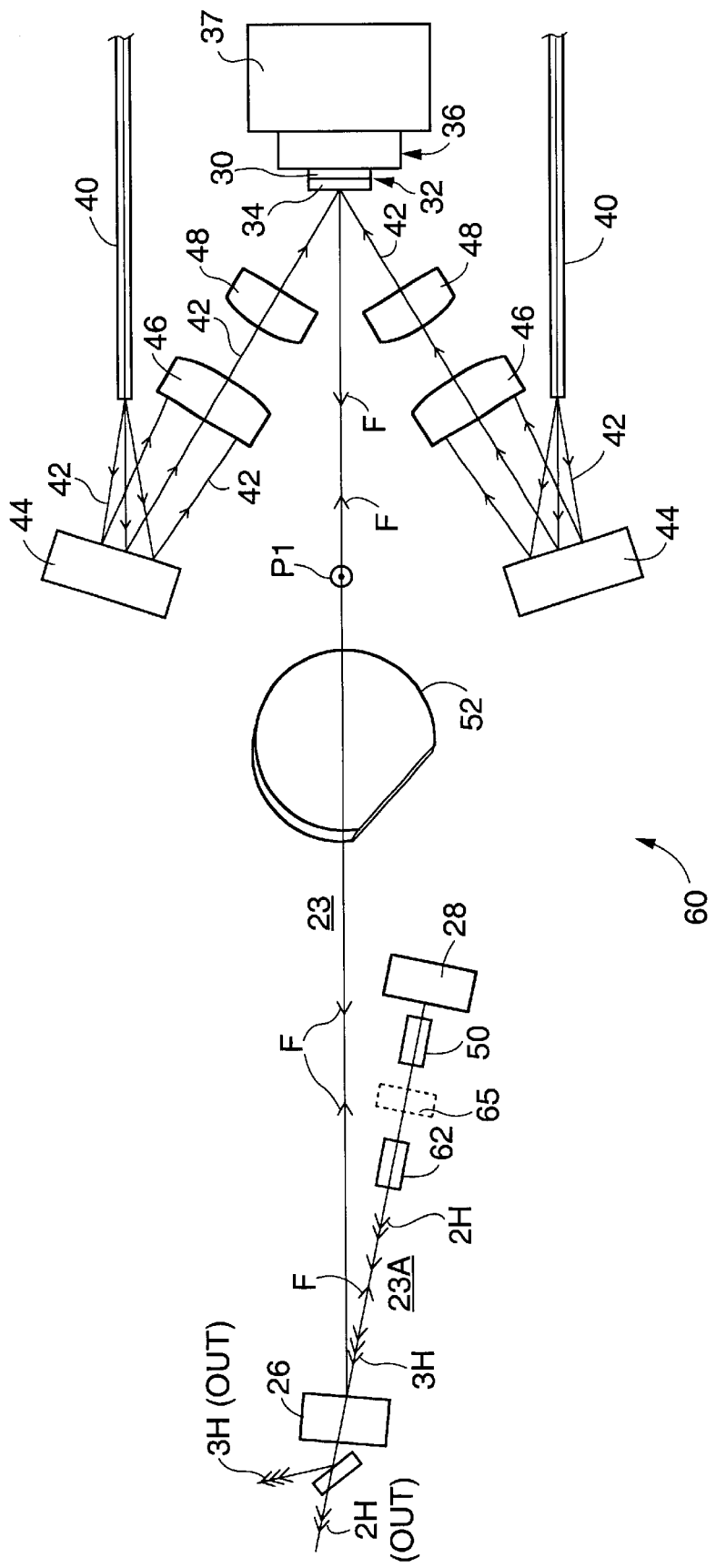
FIG. 4. schematically illustrates another preferred embodiment of an OPS-laser in accordance with the present invention having a resonator including an OPS-structure and two optically-nonlinear crystals arranged for intracavity frequency-tripling the fundamental-wavelength of the OPS-structure.

Referring now to FIG. 4, a laser 60 including a resonator 23 is schematically illustrated. Laser 60 is identical in most regards to laser 20 of FIG. 1, with the following exceptions. Mirror 28 is coated for high reflectivity at the fundamental and second (2H) harmonic wavelengths. Mirror 26 is maximally reflective at the fundamental-wavelength and highly transmissive at the 2H and 3H-wavelengths. An optically-nonlinear crystal 62, is located between optically-nonlinear crystal 50 and mirror 26 in folded arm 23A of resonator 23. Optically-nonlinear crystal 62 is arranged to mix the fundamental and 2H wavelengths (frequencies), thereby generating frequency-tripled radiation, indicated in FIG. 4 by triple arrows 3H. Both 2H and 3H-radiation leave resonator 23 via fold-mirror 26. The 2H and 3H-radiations are then separated by a dichroic beamsplitter 64.

Now, third-harmonic generation (mixing of fundamental and 2H frequencies) is known to be proportional (dependent on optically-nonlinear crystal characteristics) to the product of the fundamental and second-harmonic power. So, based on experimentally established values for these powers in this resonator, and on documented values for 3H-generation efficiency of various optically-nonlinear materials, it can be predicted with a high degree of confidence that the above-described example of a laser 60 using β-barium borate (BBO) for optically-nonlinear crystal 62 can generate about 150 mW of true-CW, single-mode, laser output-power at a wavelength of 250 nm, assuming an intracavity fundamental power of about 300 W at 750 nm generating about 5.0 W of 2H-radiation (375 nm).

A BBO crystal (crystal 62) suitable for this process is cut for propagation at an angle of 48 degrees from the optic axis, in a plane containing the optic (Z) axis and making an angle of 30 degrees with the X-Z crystallographic plane. Fundamental-radiation and 2H-radiation propagate with polarization perpendicular to the optic axis, (ordinary polarization). The 3H-radiation is generated with extraordinary polarization (normal to the fundamental polarization).

Computations based on published data from crystal manufacturers (CASIX) indicate that by focussing 300 watts of 750 nm radiation down to a radius of 60 μm in optically-nonlinear crystal 62 (in arm 20A of resonator 20), together with 5 Watts of 2H-radiation (375 nm) focused coaxially in the same crystal to a radius of 50 nm, about 150 mW of 250 nm (3H) radiation is generated. The above-described BBO crystal employs type-I phase matching. This means that the fundamental and the 2H radiation must have the same polarization within the crystal.

The second-harmonic-generating LBO crystal (optically-nonlinear crystal 50), however, generates 2H-radiation with polarization orthogonal to the polarization of the fundamental-radiation. The polarization of the 2H-radiation, accordingly, must be rotated by 90 degrees before it enters optically-nonlinear crystal 62. This may be achieved by a birefringent quartz plate (polarization rotator) of such design that it has retardation of an even integer multiple of $\pi$ for the fundamental radiation, and retardation of an odd integer multiple of r for the 2H radiation.

Such a polarization-rotator (depicted in FIG. 4 in phantom as polarization-rotator 65) is inserted in the common path (arm 20A) of the fundamental and 2H-radiation between optically nonlinear crystals 50 and 62. Polarization-rotator 65, leaves the polarization of the fundamental-radiation unaltered, and rotates the linear polarization of the 2H-radiation by an amount equal to twice the angle between the initial polarization and the direction of the optic-axis of the retardation plate.

As an alternative, a BBO crystal may be cut for type-II mixing, so that polarization-rotator 65 is not required to modify the polarization of the 2H-radiation. Conversion in this case, however, can be expected to be less efficient.

Providing a resonator mirror or reflector on any optically nonlinear crystal in a OPS-laser resonator in accordance with the present invention is not precluded. However, additional measures such as temperature control of the crystal may be required to resolve the conflicting alignment requirements for the resonator and the cyrstal.

In resonator 23 of FIG. 4, third-harmonic generation from 970 nm fundamental-radiation is also possible using the alternatives discussed above for 750 nm fundamental radiation. Numerical simulations indicate that such third-harmonic generation could generate about 150 mW of 325 nm radiation. Those skilled in the art, from the above discussed example can determine appropriate nonlinear crystal parameters without further detailed description. Accordingly, no such detailed description is presented herein.

The 150 mW of third-harmonic radiation exemplified above represents more than a twenty-times increase in power on third-harmonic generation over the maximum believed to have been reported in the prior art for only second-harmonic generation. The arrangement for generating this third harmonic radiation represented by laser 60, however, is arguably a somewhat inefficient approach to IC generation of third harmonic radiation. Significant improvements in harmonic output-power are possible in another family of OPS-laser resonators in accordance for the present invention discussed below, beginning with reference to FIG. 5.

Figure 5:
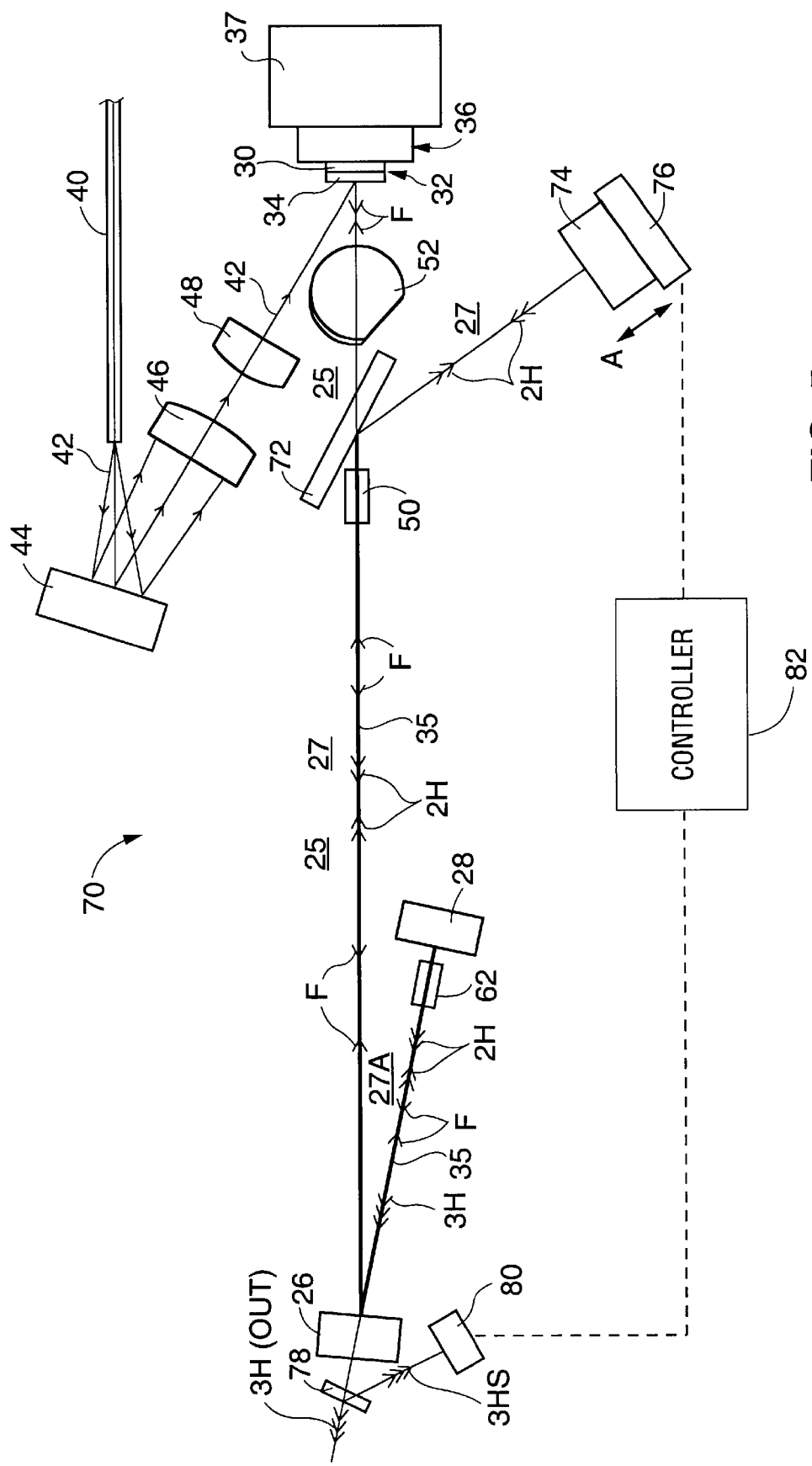
FIG. 5. schematically illustrates yet another preferred embodiment of an OPS-laser in accordance with the present invention having a first resonator including an OPS-structure and a second resonator having a common optical path with the first resonator, the common optical path of the resonators including two optically-nonlinear crystals arranged for intracavity frequency-tripling the fundamental-wavelength of the OPS-structure.

In FIG. 5, yet another embodiment 70 of an OPS-laser in accordance with the present invention is schematically depicted. Laser 70 includes two resonators 25 and 27 having a common, axial path 35 (indicated in bold line in FIG. 5) over a portion of their total length. Resonator 25 may be defined as a "fundamental resonator" and is terminated at one end thereof by mirror 28 and at the other end thereof by mirror-structure 30 of OPS-structure 32. Resonator 25 is folded by a fold-mirror 26. OPS-structure 32 is mounted and pumped as described above for lasers 20, and 60. Only one pump-light-delivery fiber and associated focussing optics are depicted in FIG. 5, for clarity.

Resonator 27 may be defined as a "second-harmonic resonator". It is used to build up 2H-radiation to levels much higher than are achieved in the simple double-pass arrangements of above-described resonators 22 and 23. Resonator 27 is terminated at one end thereof by mirror 28 and at the other end thereof by a mirror 74. Resonator 27 is also folded by a fold-mirror 26. Fold-mirror 26 in this embodiment is coated for maximum reflection at the fundamental and 2H-wavelengths and maximum transmission at the 3H-wavelength. Mirror 28 in this embodiment is coated for maximum reflection at the fundamental, 2H and 3H-wavelengths. The axes of the resonators are folded together by a dichroic beamsplitter 72 coated for maximum reflection at the 2H-wavelength and maximum transmission at the fundamental-wavelength. Accordingly, the common (here, folded) axial path of resonators 25 and 27 extends between beamsplitter 72 and mirror 28. It is pointed out here, that all coatings mentioned above are believed to be within the capabilities of commercial suppliers of optical coating services. One such supplier is Coherent Auburn Group, of Auburn, Calif.

Located in the common axial-path of resonators 27 and 27, proximate beamsplitter 72, is an optically-nonlinear crystal 50 arranged for doubling the fundamental-wavelength. The 2H-radiation generated by the frequency-doubling circulates and builds up in resonator 27, thereby greatly increasing the amount of intracavity 2H-radiation compared with the simple "double-pass" arrangement of laser 20 of FIG. 1. Located in common, folded portion 27A of resonators 25 and 27, (wherein, of course, both fundamental and 2H-radiation are circulating) is an optically-nonlinear crystal 62 arranged for mixing the fundamental and 2H-radiation to generate 3H-radiation. 3H-radiation so generated escapes the resonators via fold-mirror 26. Regarding the resonators in general, the following should be noted.

It is preferable that resonators 25 and 27 have about the same length and are similarly optically configured. This provides that the mode-size for fundamental and 2H-radiation is about the same, thereby maximizing mixing efficiency. It is also preferable that the resonators are interferometrically-matched to maintain an optimum phase-relationship between the circulating fundamental and 2H-radiation at the location of optically-nonlinear crystal 50. This is required to ensure that 2H-radiation generated in optically-nonlinear crystal 50 is added, in phase, to the 2H-radiation circulating in the 2H-resonator. This ensures that circulating 2H-radiation can grow to high levels, thereby providing a high conversion-efficiency in the BBO mixing-crystal (optically nonlinear crystal 62). In this regard, it is also preferable that fundamental resonator 25 operate in only a single axial-mode to avoid loss of power from mode-competition. Conditions for providing single axial-mode operation are discussed in detail further hereinbelow.

One arrangement for providing interferometric-matching of the resonators is to provide an axial driver 76, such as a piezo-electric driver, for mirror 74 of resonator 27. As mirror 74 is axially-driven, circulating 2H-radiation rises to a maximum level and falls to a minimum level (which may be zero or near-zero) corresponding respectively to a maximally-in-phase condition and a maximally-out-of-phase condition at optically-nonlinear crystal 50 for the fundamental and 2H-radiation (standing waves).

Correspondingly, 3H-output-power would rise and fall. A beamsplitter 78 directs a small sample-fraction 3HS of the 3H-output to a detector 80. Detector 80 is cooperative with a controller 82 which adjusts driver 76 to maintain peak output-power.

As noted above, third-harmonic generation is proportional to the product of the fundamental and second-harmonic power. By incorporating a second resonator for 2H-power, laser 70 provides that a much greater 2H-power is available for mixing than is the case in laser 60 of FIG. 4, and, further, without any increase being required in the fundamental-power. So, based on above-discussed values for available fundamental-powers in this resonator and documented values for 2H-generation efficiency of LBO it can be numerically determined that 300 W of circulating 750 nm radiation would generate about 200 W of circulating 375 nm radiation in resonator 27. The double-pass combination of these in an optically nonlinear crystal 62 of β-barium BBO can generate about 4 W of true-CW, single-mode, laser output-power at a wavelength of 250 nm. Similar output-power levels for 325 nm radiation can be determined for 3H-conversion of 976 nm radiation. This is a more than a six-hundred-times increase in power on third-harmonic generation over the maximum believed to have been reported for only second harmonic generation in prior-art OPS-lasers.

An optically-nonlinear (mixing) crystal preferable for laser 70 is the same as that discussed above with reference to laser 60. Care should be exercised in the design of resonator 25 of laser 70, however, in particular concerning the sizes of the beams within the optically-nonlinear crystals 50 and 62.

The fundamental and 2H-beams are preferably focused tightly in optically nonlinear crystal 62 to maximize conversion (mixing) efficiency. An optimum range of larger beam sizes, however, is preferred for fundamental-radiation in optically-nonlinear (doubling) crystal 50. Extensive numerical modeling of coupled resonators 25 and 27 indicates that for an LBO crystal having a length of 15 mm, the spot-sizes of the fundamental beam at the OPS-structure and in the doubler crystal are preferably about the same. This result simplifies the design of the resonator, since it makes it possible to place the doubling crystal in the proximity of the OPS-structure (as illustrated in FIG. 5), without having to create, in the common optical path of resonators 25 and 27, a tightly-focused waist in which to place optically-nonlinear (doubling) crystal 50. In one preferred resonator configuration, the fundamental beam has a spot-size of about 200 $\mu$m at OPS-structure 32, a spot-size of about 200 $\mu$m in optically-nonlinear crystal 50, and a spot-size of about 50 $\mu$m in optically-nonlinear crystal 62. The 2H-resonator 27 is designed so that the spot-size of the 2H-beam in optically-nonlinear crystal 50 is about 150 $\mu$m, and in optically-nonlinear crystal 62 is about 40 $\mu$m.

Figure 6:
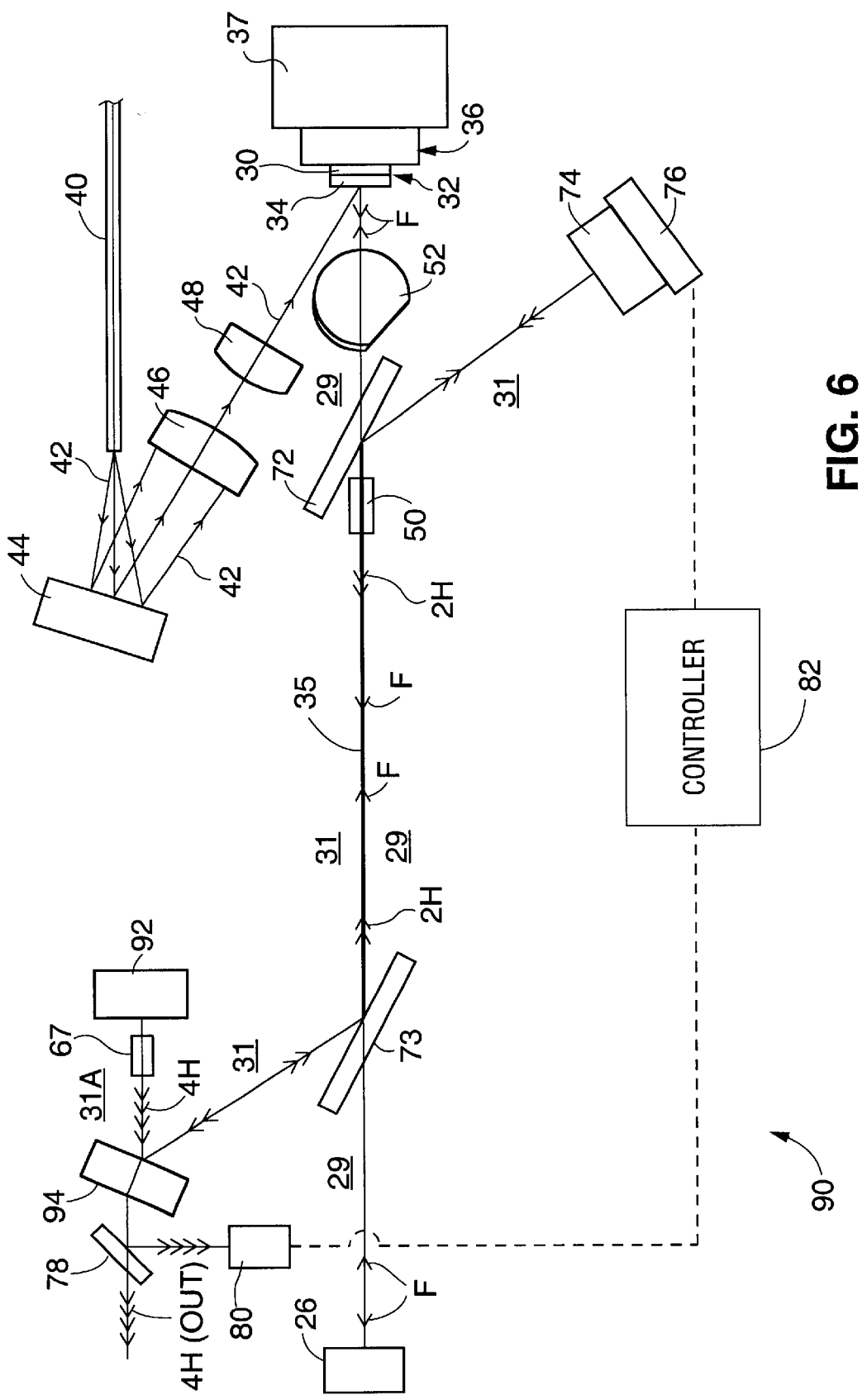
FIG. 6 schematically illustrates still another preferred embodiment of an OPS-laser in accordance with the present invention having a first resonator including an OPS-structure and a second resonator having a common optical path with the first resonator, the resonators being arranged for intracavity frequency-quadrupling the fundamental-wavelength of the OPS-structure.

Referring now to FIG. 6, still another embodiment 90 of an OPS-laser in accordance with the present invention is depicted. Laser 90 includes two resonators 29 and 31 having a common axial path 35 (indicated in bold line in FIG. 6) over a portion of their total length. Resonator 29 may be defined as a "fundamental resonator" and is terminated at one end thereof by mirror 26 and at the other end thereof by mirror-structure 30 of OPS-structure 32. OPS-structure 32 is mounted and pumped as described above for lasers 20, and 60. Only one pump-light-delivery fiber and associated focussing optics are depicted in FIG. 6, for clarity.

Resonator 31 may be defined as a "second harmonic resonator". Resonator 31 is terminated at one end thereof by mirror 74, and at the other end thereof by a mirror 92. Resonator 31 is folded by a fold-mirror 94. Mirror 28 in this embodiment is coated for maximum reflection at the fundamental-wavelength. Mirror 74 is coated for maximum reflection at the 2H-wavelength. Mirror 92 is coated for maximum reflection at the fundamental, 2H, and, fourth harmonic (4H) wavelengths. Mirror 94 is coated for maximum reflection at the 2H-wavelength and maximum transmission at the 4H-wavelength.

The axes of the resonators are folded together by dichroic beamsplitters 72 and 73, each thereof coated for maximum reflection at the 2H-wavelength and maximum transmission at the fundamental-wavelength. Accordingly, the common axial-path of the resonators 29 and 31 extends only between beamsplitters 72 and 73. For reasons discussed above, mirror 74 is mounted on a driver 76 controlled by a controller 82 in accordance with power detected by detector 80 to interferometrically-match resonators 29 and 31.

Optically-nonlinear crystal 50 is arranged for frequency-doubling fundamental-radiation circulating along common path 37 of resonators 29 and 31. Frequency-doubled radiation so generated circulates and builds up in resonator 31. Another optically-nonlinear crystal 67 is located in folded portion 31A of resonator 31 between mirrors 92 and 94 thereof. Optically-nonlinear crystal 67 is arranged for frequency-doubling circulating frequency-doubled radiation 2H thereby generating frequency-quadrupled (4H) radiation. The 4H-radiation exits resonator 31 via fold-mirror 94.

Such a resonator configuration is advantageous in the generation of 244 nm radiation through fourth-harmonic generation of 976 nm. A preferred optically-nonlinear (doubling) crystal 50 for this application is an LBO crystal having a length of about 15.0 mm, with orientation of the crystal-axes identical to those described above with reference to laser 20 of FIG. 1. Optically-nonlinear (quadrupling) crystal 67 is preferably a BBO crystal having a length of about 8.0 mm. This crystal is preferably cut for propagation at an angle of 54 degrees from the optic-axis, in a plane containing the optic (Z) axis and making an angle of 30 degrees with the X-Z crystallographic plane of the optically-nonlinear crystal.

The 2H-radiation propagates with polarization perpendicular to the optic axis, (ordinary polarization) the 4H radiation is generated with extraordinary polarization (normal to the 2H-polarization). Preferably mirror 26 has a radius of curvature of 30 cm., mirror 94 has a radius of curvature of 10 cm, and mirrors 74 and 92 are flat mirrors.

Similar considerations apply for the beam spot-size in optically-nonlinear crystals 50 and 67 as apply for crystals 50 and 63 of FIG. 5. Numerical simulations indicate that an optimum, relatively large, beam-size exists for the beams inside the optically-nonlinear (doubler) crystal 50. The fundamental-radiation spot-size in optically-nonlinear (doubler) crystal 50 is preferentially the same as the spot-size at OPS-structure 32, for a crystal length of about 15 mm. The "second harmonic resonator" 31 is dimensioned so as to generate a 2H spot-size in optically-nonlinear crystal 67 equal to the fundamental beam spot-size divided by the square root of two (1.414), so that a beam sustained by the resonator 31 has the same transverse size as beam generated by optically-nonlinear crystal 50. The 2H-radiation is focused by concave fold-mirror 94 into the optically-nonlinear crystal 67, to a spot-size of about 50 microns ($1/e^2$ radius).

Another preferred material for optically-nonlinear crystal 67 is cesium lithium borate (CLBO). This material can advantageously substitute BBO for frequency-doubling 488 nm radiation in this and other applications. A CLBO crystal for frequency-doubling 488 nm radiation is preferably cut for propagation of the beam at an angle of 75.7 degrees from the Z-axis, in a plane containing the Z axis and at an angle of 45 degrees from the X-Z plane. The 244 nm radiation so generated is polarized in the plane defined by the direction of propagation and the Z-axis (extraordinary polarization), the 488 nm radiation is polarized perpendicular to the 244 nm radiation. The nonlinear-efficiency of CLBO for this application is the same as that of BBO. CLBO, however, has a significant advantage of a five-times-greater angular acceptance than BBO, and a four-times smaller walk-off angle than BBO. A greater acceptance angle and smaller walk-off angle both contribute to increasing the net conversion-efficiency of an optically nonlinear crystal. First order considerations of acceptance angle and walk-off angle indicate that the conversion-efficiency of CLBO may potentially be several times higher than the efficiency of BBO. These first-order considerations are applicable in general to frequency-doubling radiation having a wavelength between about 425 nm and 525 nm in any resonator. The radiation in that wavelength range may be the fundamental-radiation or harmonic radiation of any gain-medium.

While embodiments of high-power OPS-lasers in accordance with the present invention are described above with respect to intracavity frequency-multiplication arrangements, it will be evident to one skilled in the art that high-power OPS-laser in accordance with the presentation may be operated, without intracavity optically-nonlinear crystals, simply as an efficient source of high-power single-mode fundamental radiation. A fundamental output power of at least 2 W and even greater than 5 W may be achieved in fundamental resonator embodiments of the an OPS-laser in accordance with the present invention.

Figure 7:
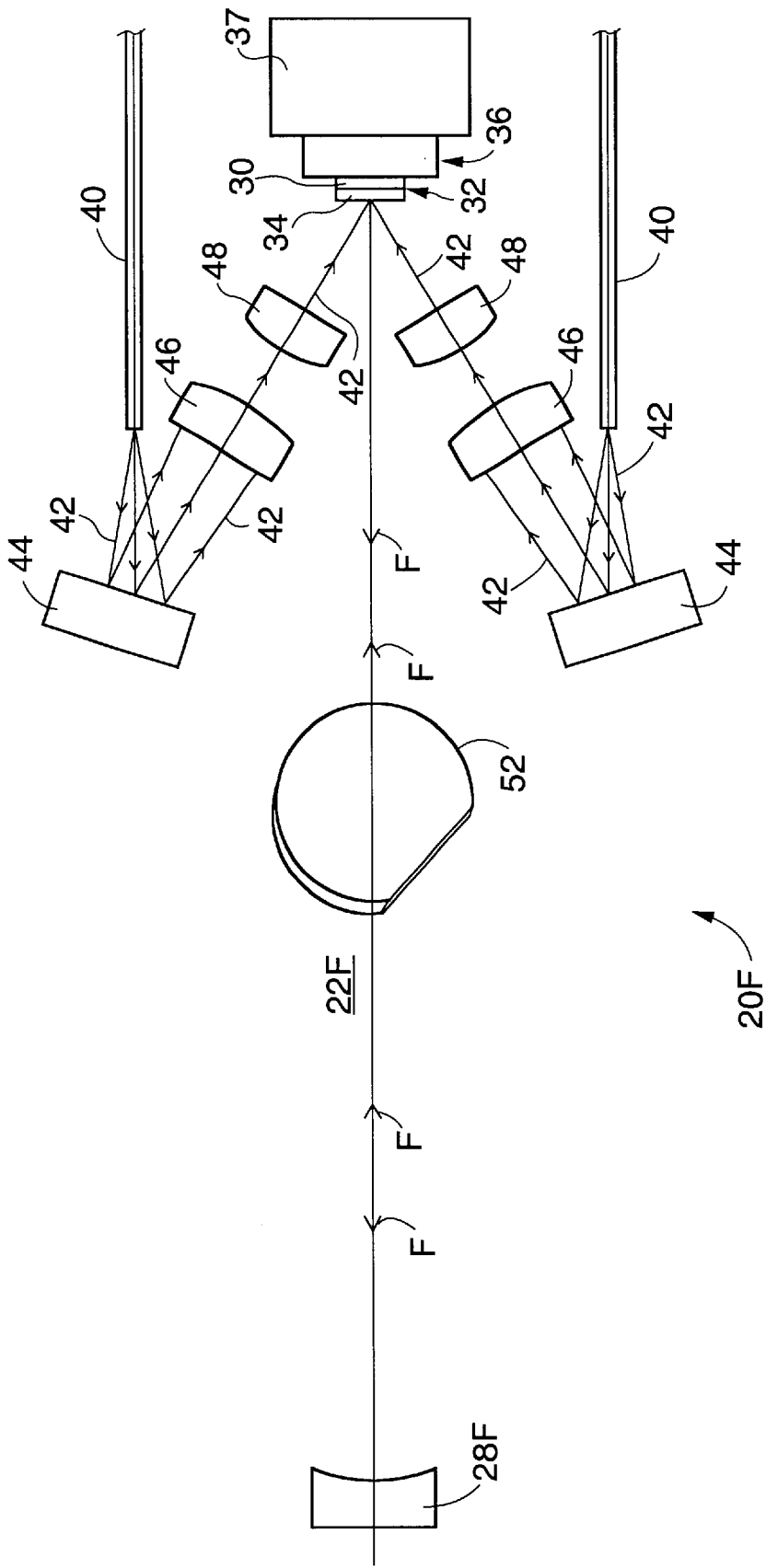
FIG. 7 schematically illustrates a further preferred embodiment of an OPS-laser in accordance with the present invention having a straight resonator including an OPS-structure and a birefringent filter.

By way of example, 10 W of single axial-mode fundamental radiation at 976 nm was generated in an OPS-laser 20F (see FIG. 7) including a simple linear (not folded) resonator 22F formed by a concave output-coupling mirror 28F and mirror structure 30 of OPS-structure 32. Mirror 28F has a radius of curvature of 30 cm and is spaced apart from OPS-structure 32 by a distance of about 15.0 cm. A birefringent filter 52 is preferably included in resonator 22F. This allows for output-wavelength adjustment which may be required if manufacturing tolerances of OPS-structure 32 provide peak gain at some wavelength slightly displaced from a desired output-wavelength.

Such an inventive OPS-laser could be used as a radiation-source for extracavity frequency-multiplication using either a single-pass arrangement of optically-nonlinear crystals or by directing the fundamental-radiation into a prior-art extracavity ring-resonator, including, or formed from, an optically-nonlinear material. A high-power OPS-laser in accordance with the present invention may also provide a source of fundamental (pump) radiation for an optical parametric oscillator (OPO), co-linearly or non-colinearly pumped. Such arrangements are disclosed in co-pending U.S. patent application Ser. No. 09/179,022 by the same inventors, the complete disclosure of which is hereby incorporated by reference.

Proceeding now with a description of mode-control and other scaling aspects of the present invention, a surprising discovery was that single axial-mode operation of the inventive lasers was simply achieved even at the relatively long resonator-lengths required for the exemplified high-power operation. The long resonator length is required for reasons, inter alia, as follows.

The gain-structure of an OPS has some inherent limitations due to the need to strongly absorb pump-light in layers separating the QW layers. These QW layers are preferably optically-spaced apart by a half-wavelength of the fundamental radiation. Prior-art investigations of such structures seem to have resulted in a general belief among practitioners of the relevant art that a number of about fifteen such QW layers is about optimum. This results at least from a consideration that the pump-light, through absorption in the structure, may not penetrate effectively more than fifteen half-wavelengths deep. It should be noted here that use of gain-structures with 15 QW layers in examples of OPS-lasers in accordance with the present invention should not be construed as limiting the inventive OPS-lasers or indicating that optimization of the depth and QW content of such gain-structures has reached a limit. In developing the inventive OPS-lasers, emphasis has simply been placed, with evident success, at addressing other scaling issues and other structural issues of OPS-structures. A discussion of such other issues is set forth below.

Considering, for the purposes of this description that some limit, whatever it is, to the depth or QW layer content of OPS gain-structures exists, then another approach to increasing available gain (accordingly power) in the gain-structure is necessary. One such approach to increasing output-power in accordance with the present invention is to increase the pumped-area on the OPS-structure.

In order to take advantage of a larger pumped-area, however, a resonator must be increased in length such that the resonator mode-size is sufficient to extract all of the gain available in the pumped-area. Resonator length is increased in proportion to the square of the increase in mode size. Accordingly, with increasing power being derived, inter alia, from increasing mode size, the dimensions of the inventive OPS-resonators radically depart from the prior-art compactness which appears from prior-art teachings to be an attractive feature of OPS-lasers. Indeed, dimensions of the inventive OPS-lasers become comparable with the dimensions of prior-art diode-pumped solid-state (DPSS) laser-resonators of similar output-power and beam-quality. As will be evident from this description, however, these inventive resonators, particularly those arranged for IC frequency-conversion, have certain characteristic design features particularly related to the use of an OPS-structure as a gain-medium.

One originally anticipated problem in drastically increasing the length of an external OPS-laser resonator is the problem of mode-control, specifically, operating in a single axial-mode. Operation in a single axial-mode is preferred, inter alia, for maximizing and decreasing temporal fluctuation of output-power. As noted above operating a "fundamental resonator" in a single axial-mode is particularly preferred in multiple-resonator IC frequency-multiplication embodiments of OPS-lasers in accordance with the present invention.

In above-mentioned prior-art DPSS-lasers, as the length of a resonator is increased, the number of possible axial (longitudinal) modes of oscillation is also increased, absent any measures for preventing this. It would also be anticipated, on prima facie consideration, that this problem would exacerbated in an OPS-laser because of the greater gain-bandwidth of a semiconductor gain-medium compared with a solid-state (dopant:host) gain-medium of a DPSS-laser.

Typically, a large number of axial-modes leads to a fluctuating (noisy) power output as the modes compete chaotically for gain in the gain-medium. Prior-art measures which have been taken in DPSS-lasers to limit the number of oscillating modes and reduce output-noise include selective placement of the gain-medium in the resonator in positions where phase-relationships between adjacent modes limit this mode-competition. This approach has met with only limited success in prior-art DPSS-lasers. It is believed that, practically, true single mode operation has only been possible in prior-art lasers by mechanically stabilizing the resonator and including a highly wavelength-selective element in the resonator, with its attendant problems of resonator loss, maintenance of tuning, and the like.

Surprisingly it has been found that single axial-mode operation is possible in a high power OPS-laser in accordance with the present invention apparently independent of the physical length of the resonator, at least up the 25 cm length of the above exemplified inventive laser. It is believed that this length could be significantly further extended, for example, up to 100 cm or greater, while still maintaining single-axial-mode operation without any special provision for providing such operation.

It is believed, without being limited to a particular theory, that this surprising discovery may be explained as follows. In all above-described embodiments of the present invention, gain-structure 34 of OPS-structure 32 is located precisely at the end of the "fundamental-resonator", a position in which all possible axial-modes of operation (standing waves) have a node, i.e., are exactly in phase.

An OPS gain-structure of the present invention, is only about seven wavelengths "long". The resonator itself may be tens of thousands or even hundreds of thousands of wavelengths long. Accordingly, even widely numerically separated modes (i.e., N and N±m where m is an integer) do not become appreciably out of phase within the gain-medium.

Now, the OPS gain-structure, with half-wavelength-spaced QW layers only provides gain in narrow region one-half-wavelength apart. Accordingly, as the actual wavelengths of adjacent possible modes differ fractionally, at most, by only a few millionths of a wavelength, or a few hundredths of the width of the QW layers, all possible modes have about an equal chance to extract the available gain. That mode which begins to oscillate first wins the "mode-competition" and deprives the others of the gain needed to oscillate, thereby forcing single axial-mode operation.

To ensure true single-mode (single-frequency or $TEM_{00}$) operation in an OPS-laser in accordance with the present invention, it is preferable to design resonators, wherein, as exemplified above, the pumped-area (pump-spot) and fundamental spot-size at OPS-structure 32 are about the same, i.e., the ratio of pump spot-size to mode-size is about unity (1.0) or less. This provides that there is insufficient gain available outside the $TEM_{00}$ spot-size to support other transverse-modes of oscillation of different frequencies while still deriving maximum gain from the pumped area.

Above-described OPS-lasers in accordance with the present invention have been described in terms of having physically long resonators, it being understood here, that what is referred to as resonator-length is the axial-length or distance between resonator end-mirrors. One skilled in the art, however, will recognize that increasing the physical resonator length is not the only way to provide for a large mode-size in the gain-structure 34 of OPS-structure 32 for increasing power. Incorporating a suitable optical system within a resonator can produce a large "equivalent length" for the resonator, even when the actual (physical) length of the resonator is relatively short. This may be used to provide a large spot-size at an OPS-structure in accordance with the present invention with a resonator having a relatively short physical length. An example of such a resonator arrangement used in a prior-art, flashlamp-pumped Nd:YAG laser, employing a telescopic arrangement of lenses in the resonator, is described in a paper by Hanna et al., Opt. Quantum Electron. 13, 493 (1981).

Ray optics considerations indicate, however, that in any such complex resonator, wherein a mirror-structure 30 of an OPS-structure 32 forms at one extremity of the resonator, the complex resonator is equivalent (as seen from mirror-structure 30) to a simple resonator consisting of a mirror (generally curved) placed at a specific distance from mirror-structure 30 of the OPS-structure 32. In other words, any arbitrarily complex resonator can always be reduced, for the purpose of determining mode-size at gain-structure 34 of OPS-structure 32, to an equivalent simple resonator having mirror-structure 30 of OPS-structure 32 at one end thereof, and a curved mirror at the other end thereof. Accordingly, in long-resonator-type OPS-lasers in accordance with the present invention there can be defined an equivalent or optical resonator-length necessary to provide a desired mode-size at OPS-structure 32. This optical length definition encompasses the relatively simple resonator structures described above, wherein the optical length is close to the physical length as well as any more complex arrangements for shortening physical length while maintaining a sufficiently large optical length. A preferred optical length for the resonator of an OPS-laser in accordance with the present invention is at least about 5 cm and preferably greater than about 10 cm.

The most straightforward way to increase the mode or spot-size at an OPS-structure 32 in an OPS-laser in accordance with the present invention is to increase the optical length of the resonator by simply increasing the physical length of the resonator, with an appropriate choice of the radius of curvature of resonator mirrors. The beam spot-size required for the generation of multi-watt radiation in the above-exemplified laser 20 of FIG. 1 was obtained by employing a resonator length of 25 cm, which, even though much larger than resonator lengths of prior art OPS-lasers, is still small enough to allow for convenient packaging of the laser while still allowing operation in a single axial-mode.

Figure 8:
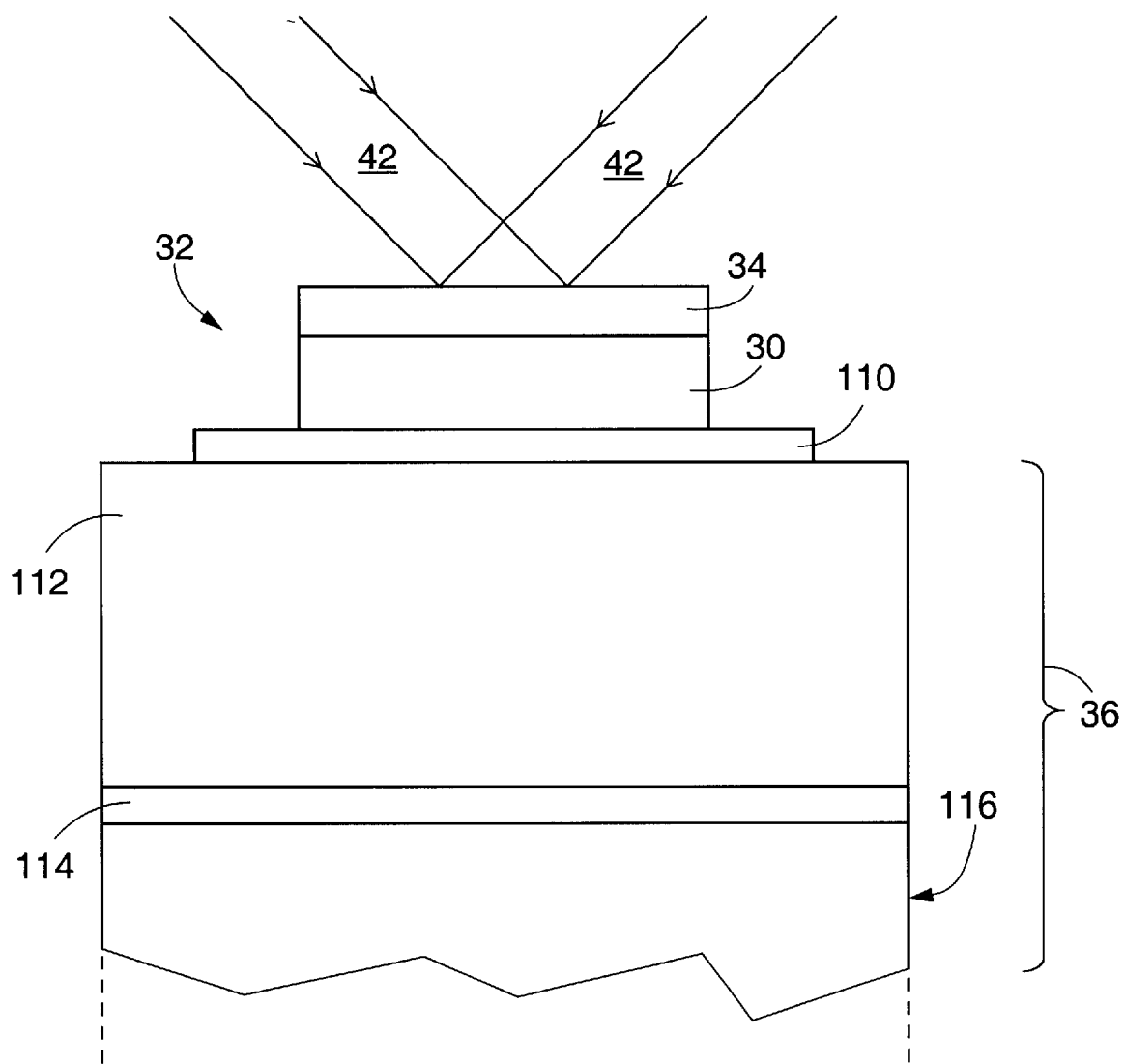
FIG. 8 schematically illustrates the OPS-structure of any of FIGS. 1 and 4–7 bonded to a heat-sink assembly in accordance with the present invention.

Turning next to thermal management issues, as discussed briefly above, thermal-management of OPS-structure 32 in an OPS-laser in accordance with the present invention is particularly important. Accordingly, a discussion of some important aspects of the thermal management is set forth below with reference to FIG. 8. FIG. 8 depicts, in detail, OPS-structure 32 and heat-sink 36 on which it is bonded.

The thermal-management problem may be summarily defined as follows. Pump-light 42 is absorbed in gain-structure of OPS-structure 32. That portion of the absorbed pump-light which does not generate electrical-carriers, i.e., does not provide laser-radiation, generates heat in gain-structure 34. This heat must be conducted away by heat-sink 36 at a rate sufficient to keep the temperature of gain-structure preferably below a temperature of about 90° C. It should be noted here that this temperature is merely provided for guidance and should not be considered critical or limiting.

Mirror-structure 30 impedes the conduction of heat from gain-structure 32 to heat-sink 36. As discussed above, in a preferred, inventive heat-sink arrangement, OPS-structure 32 is bonded, by a solder layer 110, to a layer 112 of synthetic diamond, preferably having a thickness of about 0.3 mm. Diamond-layer 112, in turn is bonded, by another solder layer 114, to a copper-bodied microchannel-cooler 116.

In developing a heat-sink configuration for OPS-structure in accordance with the present invention, consideration was first given to the heat-sink properties of massive substrates of copper and diamond. From calculations considering the pump-power density provided by the above exemplified 34 W of pump-power delivered directly on the surface of a massive (essentially infinite in extent) copper heat-sink it was estimated that surface temperature on such a heat-sink would be 110° C. In practice, the 34 W of pump power would not be delivered directly to the surface but would be impeded by the materials of mirror-structure 30. These materials have a relatively low thermal-conductivity. Accordingly, the temperature of gain-structure 34 could be expected to be about 15° C. higher than the highest temperature at the surface of the heat-sink.

From calculations considering the pump-power density provided by the above exemplified 34 W of pumping delivered directly on the surface of a massive CVD-diamond (having a thermal-conductivity 2.5 times higher than copper) heat-sink, it was estimated that the surface temperature on such a heat-sink would be 45° C. This would be a tolerable temperature for gain-structure 34 of OPS-structure 32. However, a diamond (even synthetic) sufficiently large to be considered of infinite extent would be prohibitively expensive, if at all obtainable.

Giving consideration to a microchannel-cooler, it was determined that the surface temperature on such a cooler provided by the above exemplified 34 W of pumping delivered directly thereto would be about 110° C. It was then determined that if a relatively thin layer of synthetic diamond were bonded to the same microchannel-cooler, the surface temperature (on the diamond layer) would be only 55° C. degrees, i.e., comparable with the calculated temperature for the above-discussed hypothetical massive diamond heat-sink. This determination was significant in enabling the pump-power densities required for OPS-lasers in accordance with the present invention to be safely delivered to OPS-structure 32.

On a prima facie consideration, it may appear that at a constant pump-power density, the above-exemplified temperatures in OPS-structure 32 may be expected to be remain the same as the pumped-area thereon is increased, making power-scaling beyond the above identified levels merely a matter of increasing resonator length. On closer investigation, however, this proves not to be the case.

Figure 9:
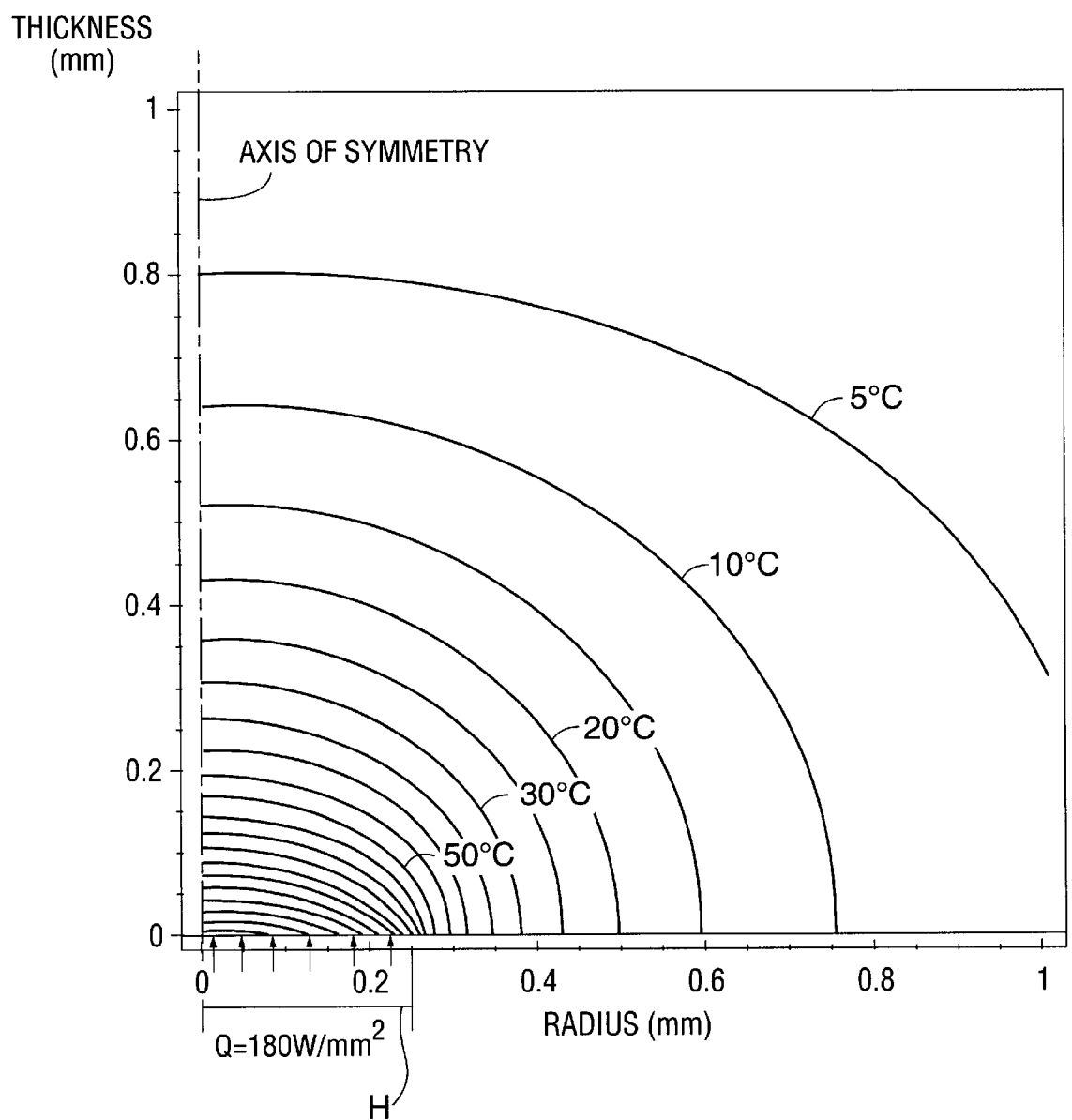
FIG. 9 is a graph depicting isothermal contours produced by uniform heat-flow into a selected area of a surface of a relatively-massive copper heat-sink.
Figure 10:
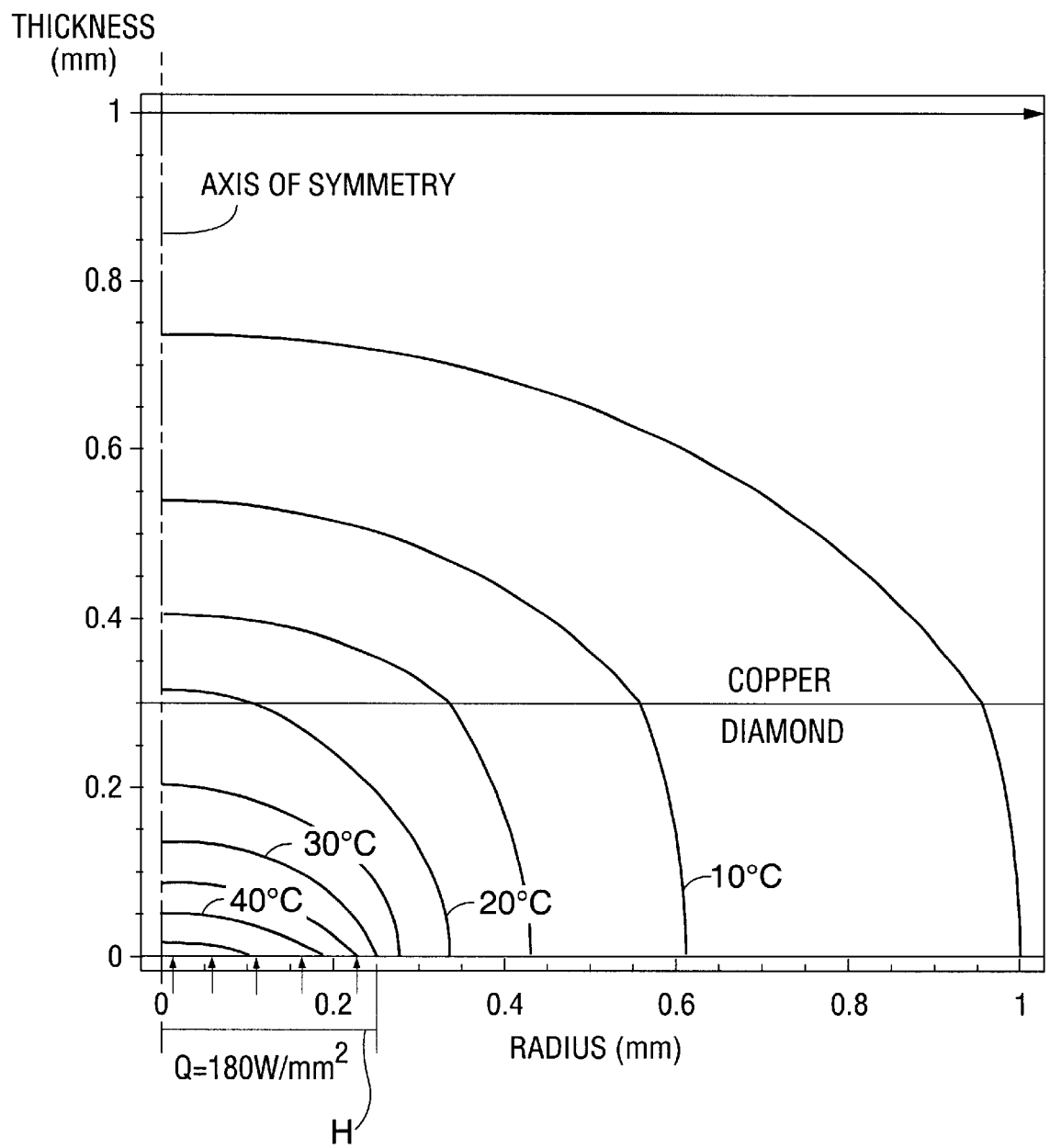
FIG. 10 is a graph depicting isothermal contours produced by uniform heat-flow into the selected area of FIG. 7 on a surface of a CVD-diamond layer bonded to a relatively-massive copper heat-sink.

By way of illustration of the pumped-area scaling problem, FIGS. 9 and 10 depict computed isothermal contours (assuming radial symmetry) in respectively a relatively-massive (1.0 mm-thick) copper heat-sink and in a 0.3 mm-thick CVD-diamond layer bonded on a 0.7 mm-thick copper-heat-sink. The isothermal contours represent response to a uniform surface heating at a rate Q of 180 Watts per square mm (W/mm$^2$) within a circle H of 0.25 mm radius. (corresponding to the above-exemplified pump-power density on OPS-structure 32). Isothermal contours are at 5° C. intervals. The terminology "relatively massive", as used above, means in relationship to the dimensions of OPS-structure 32.

It can be seen from both FIGS. 9 and 10 that the temperature rises from edge to center of the heated (pumped) area. Increasing the pumped-area at the same pump-power density, accordingly, would increase the peak temperature of the OPS-structure. Fortunately, however, this increase is proportional to the square-root of the increase in area. This allows some trade-off between pump-power density and increasing pumped-area.

The effectiveness of the CVD-diamond layer, of course is also evidenced by the lower peak temperature of between 45° C. and 50° C. achieved with the diamond layer (see FIG. 10) compared with a peak temperature of about 100° C. without the CVD-diamond layer (see FIG. 9).

Synthetic diamond in single crystal form has twice the thermal-conductivity of the CVD form. Accordingly, by substituting a single crystal diamond layer for the CVD-diamond layer a further surface temperature reduction of about 20° C. could be expected. Synthetic diamond in CVD and single crystal form is available from Sumitomo Electric Industries (USA) Ltd, of New York, N.Y.

The high thermal-conductivity of the above discussed inventive arrangement of heat-sink 36 ensures not only low temperature in gain-structure 34 of OPS structure 32, but also low transverse temperature gradients in the plane of the OPS-structure. Transverse temperature gradients cause, through temperature dependence of the index of refraction of the OPS material, transverse variation of the optical path seen by the fundamental-radiation on propagation in the OPS-structure. Such gradients manifest themselves in a solid-state gain medium as "thermal-lensing" which means that the gain-medium behaves, in a first order approximation, as a positive spherical lens. This phenomenon is well known in prior-art DPSS lasers, and complicates the design of resonators for such lasers, as these resonator designs must take into account both the thermal-lensing and its variation as the pump-power level is changed. By way of example, a typical neodymium-doped yttrium vanadate (Nd:YVO$_4$) gain-medium crystal can exhibit thermal-lensing as high as seven diopters under typical pump conditions.

In considering the design of heat-sink 36 it was recognized that careful design could lead to exceptionally low values for the thermal-lensing in an OPS-laser in accordance with the present invention compared with values encountered in prior-art DPSS lasers. By way of example, in the above-described example of laser 20 (FIG. 1), employing a CVD diamond layer on a microchannel cooler as a heatsink, a thermal lensing of significantly less than one diopter was measured. The use of synthetic, single-crystal diamond instead of CVD diamond would reduce this already small thermal lensing by a factor of two. Such low thermal-lensing simplifies considerably the design of the laser resonator. Generally, in designing a resonator for an OPS-laser in accordance with the present invention, it may be assumed that there is will be no thermal lensing.

Turning now to the heat-transfer-impeding effect of mirror-structure 30 of OPS-structure 32, in the example of the inventive OPS-laser discussed above, the total thickness of mirror-structure 30 of OPS-structure 32 is about 4.1 μm. Computations, based on this total thickness; bulk thermal-conductivity values of GaAs and AlAsP; and the structure of cooled-substrate 36 as depicted in FIG. 6, indicated that because of the heat-transfer-impeding effect of mirror-structure 30, the temperature of gain-structure 34 would be between about 180° C. and 200° C. higher than would be the case, were the gain-structure directly-bonded to diamond layer 112 of cooled-substrate 36. Accordingly, a substantial portion of the potential reduction in surface temperature offered by the bonded diamond layer is sacrificed to the mirror-structure. From experimental observations of the shift of the fluorescence spectrum of gain-structure 34 under the operating conditions of the above described practical example of inventive OPS-laser, it has been determined that gain-structure 34 is at a temperature of about 90° C.

It is clear, that an improvement in the thermal-conductivity of mirror-structure 30 of OPS-structure 32 could allow a higher pump-power to be delivered to gain-structure 32. This would allow further increases in output-power. Some approaches to improving this thermal-conductivity are set forth below.

An advantage of growing OPS-structure 32 in the manner described above is that it is neither necessary that mirror-structure 32 be epitaxially-grown, nor necessary that it be formed entirely, if at all, from semiconductor materials. Given this flexibility, it is possible to design mirror-structures 30 of OPS-structures 32 in accordance with the present invention using a wide selection of materials for forming high and low refractive index layers. Accordingly, values of absolute refractive index of the materials, and thermal-conductivity of the materials, can be selected such that such that the thermal-conductivity in the axial direction of the mirror-structure (as a whole) is maximized. Clearly, of course, the materials selected must have minimal absorption (be highly transparent) for the fundamental-wavelength such that mirror-structure is capable of providing maximum reflectivity for the fundamental-wavelength. Maximum reflectivity in this regard may be defined as a value preferably about 99.9 percent or greater.

One option for increasing thermal-conductivity of mirror-structure 30 is to substitute a layer of a highly reflective metal such as aluminum, silver, gold, copper or magnesium, for several high and low refractive index layer-pairs of transparent materials, and to allow an absorption in the metal layer of about 0.1 percent. Dielectric multilayer overcoated aluminum mirrors of similar structure, for providing inexpensive high-efficiency reflectors for optical scanners, copiers and the like, are often referred to in the optical-coating art as "enhanced metal-mirrors".

A metal layer in a mirror-structure 30 in accordance with the present invention would be the last-deposited (mirror) layer and would be furthest from the gain-structure. As this metal layer, in a completed OPS-structure 32, would be in direct contact with the heat-sink, it is believed that at least 0.1 percent absorption would be tolerable.

By way of example, using the GaAs and AlAsP materials exemplified above, with a 1000 Å layer of gold as the final layer, 99.9% reflectivity could be provided by a structure having only nine pairs of GaAs and AlAsP layers. Such a structure would have a total thickness of only about 1.47 μm, i.e., about one-third the thickness of the mirror-structure of the above-described example. Accordingly up to a three-fold increase in thermal-conductivity of the mirror-structure as a whole can be anticipated.

It is believed that further reductions in thickness could be possibly be obtained by using a material having a much lower refractive index than AlAsP as a low refractive index material, for example, barium fluoride ($BaF_2$) having a refractive index of about 1.48. Using a 1000 Å-thick layer of gold as a final layer, 99.9% reflectivity could be provided by a mirror-structure 30 having as few as two pairs of GaAs and $BaF_2$ layers. Such a mirror-structure would have a total thickness of only about 0.54 μm, i.e., about one-eighth the thickness of the OPS-structure of the above described example. What is gained in thermal-conductivity by the total thickness reduction, however, will be at least partially offset by the lower conductivity of $BaF_2$ compared with AlAsP and the greater physical thickness of $BaF_2$ required to provide one-quarter wavelength optical thickness at the fundamental-wavelength.

Such "enhanced metal-mirrors" may be particularly useful in OPS-structures which have fundamental emission at wavelengths shorter than about 0.7 μm where semiconductor materials have too great an absorption to be used effectively in multilayer reflectors. For these wavelengths, use must be made of dielectric materials such as titanium oxide ($TiO_2$) and niobium oxide ($Nb_2O_5$) to provide high index layers, in combination with materials such as silicon dioxide ($SiO_2$) as a low index layer. It is useful to note that a mirror using only a combination of $TiO_2$ and $SiO_2$ layers, having the same reflectivity as a mirror made from only GaAs and AlAsP layers, would have a total thickness about fifty percent greater.

It should be noted that, depending on the selection of a highly reflecting metal for an "enhanced-metal" type mirror-structure, and the type of bonding material selected for bonding the OPS-structure to heat-sink 36, it may be necessary to add a layer, preferably of a suitable metal, on the reflective metal layer to prevent that layer from reacting, alloying or dissolving in the bonding material. As this additional layer, would be (as far as incident laser radiation is concerned) "behind" the reflective metal layer it is not important that it be highly reflecting.

Figure 11:
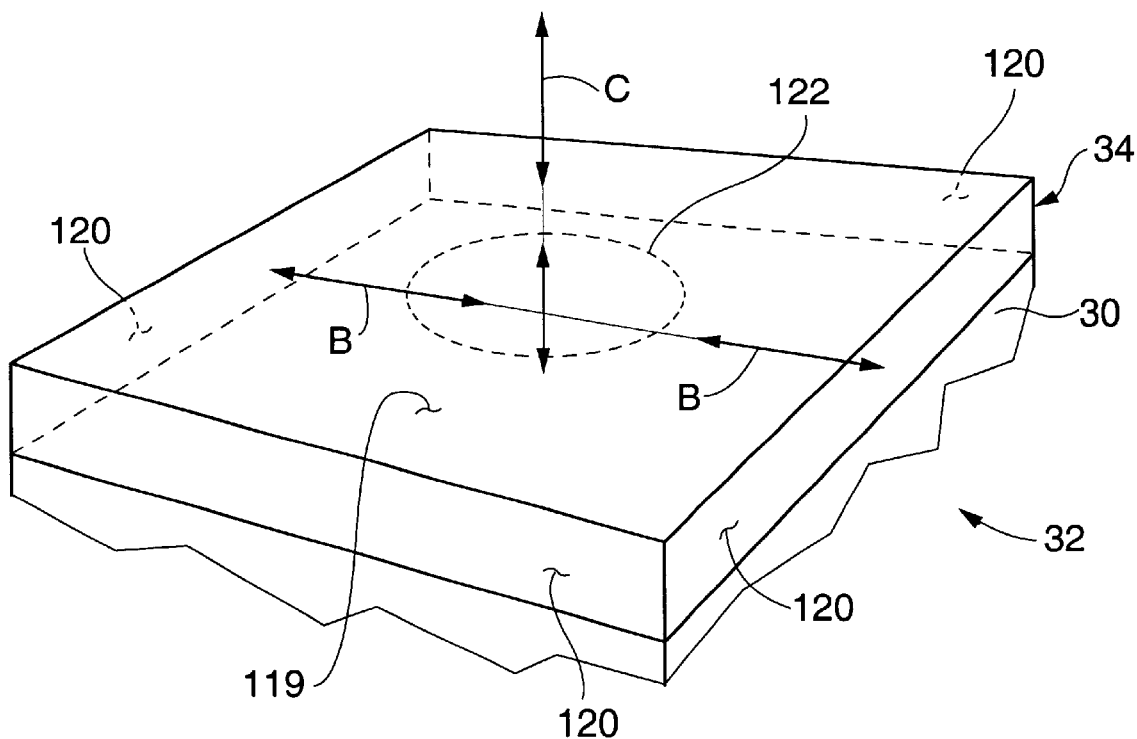
FIG. 11 is a perspective view schematically illustrating parasitic lateral oscillation in an OPS-structure in accordance with the present invention.

As discussed above, OPS-structures such as OPS-structure 32 are grown over essentially the entire area of a semiconductor wafer. After the OPS-structure is grown, the wafer is diced into chips of OPS-structure. A prior-art-preferred dicing method involves scribing and breaking the wafer to form the chips. Breakage takes place, cleanly and smoothly, along a crystalline plane of the wafer and the epitaxially grown OPS-structure thereon. Referring now to FIG. 11, an OPS-structure chip (designated here, for consistency by reference numeral 32) formed as described above, has what may be termed as an emission face 119 on gain-structure 34 and has smooth end-faces 120 in resulting from the scribe-and-break dicing method. End faces 120 are at right angle to emission-face 119 and have a relatively-high Fresnel reflectivity (about 30%) due to the relatively-high refractive index of semiconductor materials of the gain-structure. At operating powers contemplated for OPS-lasers in accordance with the present invention, absent any preventive arrangements, laser action can take place laterally (indicated in FIG. 11 by arrows B) in resonators formed by parallel pairs of end-faces 120.

During operation, such parasitic lateral oscillation would rob gain-structure 34 of OPS-structure 32 of gain which would otherwise be available for providing laser-action in the intended, surface-emitting direction (indicated in FIG. 11 by arrows C). Certain measures may be taken to suppress such parasitic lateral oscillation. One such measure comprises employing a dicing method wherein the wafer is cut or scribed completely from one side to the other with a diamond-scribe, diamond-saw, or like abrasive-cutting device. Following such scribing, end-faces 120 will be sufficiently rough or irregular that they are ineffective as mirrors. Accordingly, parasitic lateral oscillation will effectively suppressed. Other methods of roughening the end faces are not precluded.

If end-faces 120 are left smooth as a result of scribe-and-break dicing, coating the end-faces with a simple antireflection coating of material having a lower refractive index than the end-faces, such as aluminum oxide ($Al_2O_3$) or yttrium oxide ($Y_2O_3$), can reduce the reflectivity of end-faces 120 to a level where they no longer are effective as mirrors, thereby effectively suppressing parasitic lateral oscillation.

Yet another means of suppressing parasitic lateral oscillation is to ensure that the longest linear dimension (end-face length) of chip 32 (OPS-structure 32) is significantly larger than the pumped-area 122. At power levels contemplated for OPS-lasers in accordance with the present invention, the length of an end-face 120 is preferably greater than about three-times the diameter of the pumped area. Intrinsic absorption of the unpumped OPS-structure materials and the increased distance required for radiation to travel between end-faces 120 can provide sufficient loss to effectively suppress parasitic lateral oscillation even if end-face 120 are smooth.

Deliberately increasing absorption of the materials of gain-structure 34 outside the pumped area for suppressing parasitic lateral oscillation is not without the bounds of possibility. This may be accomplished, for example, after growth of OPS-structure 32, by selective doping or ion implantation. Clearly, any of the above-described measures for reducing parasitic lateral oscillation may be use alone or, where appropriate, in combination.

Turning now to selection of frequency-conversion materials for OPS-lasers in accordance with the present invention, as noted above, the range of wavelengths available from external cavity OPS-lasers may be extended by frequency multiplication, doubling or mixing. This is preferably accomplished by intracavity (IC) frequency-conversion (harmonic generation), in which an optically-nonlinear crystal is included in a resonator formed between the mirror-structure of an OPS-structure and a (external to the structure) conventional mirror. A particularly preferred optically-nonlinear crystal material for IC frequency converted OPS-lasers in accordance with the present invention is LBO.

Because of the limited power available in prior-art OPS-lasers, it has been the practice in such lasers to use an optically-nonlinear material with as high a frequency conversion-efficiency as possible, typically, $KNbO_3$. $KNbO_3$, however, has certain disadvantageous properties that make it a less-than-ideal choice for use in a high-power frequency-doubled laser in accordance with the present invention. These disadvantageous features are a certain fragility, and a limited spectral-acceptance range. The spectral-acceptance range of an optically-nonlinear material is that range of wavelengths which would be frequency-converted for a crystal of the material.

Figure 12:
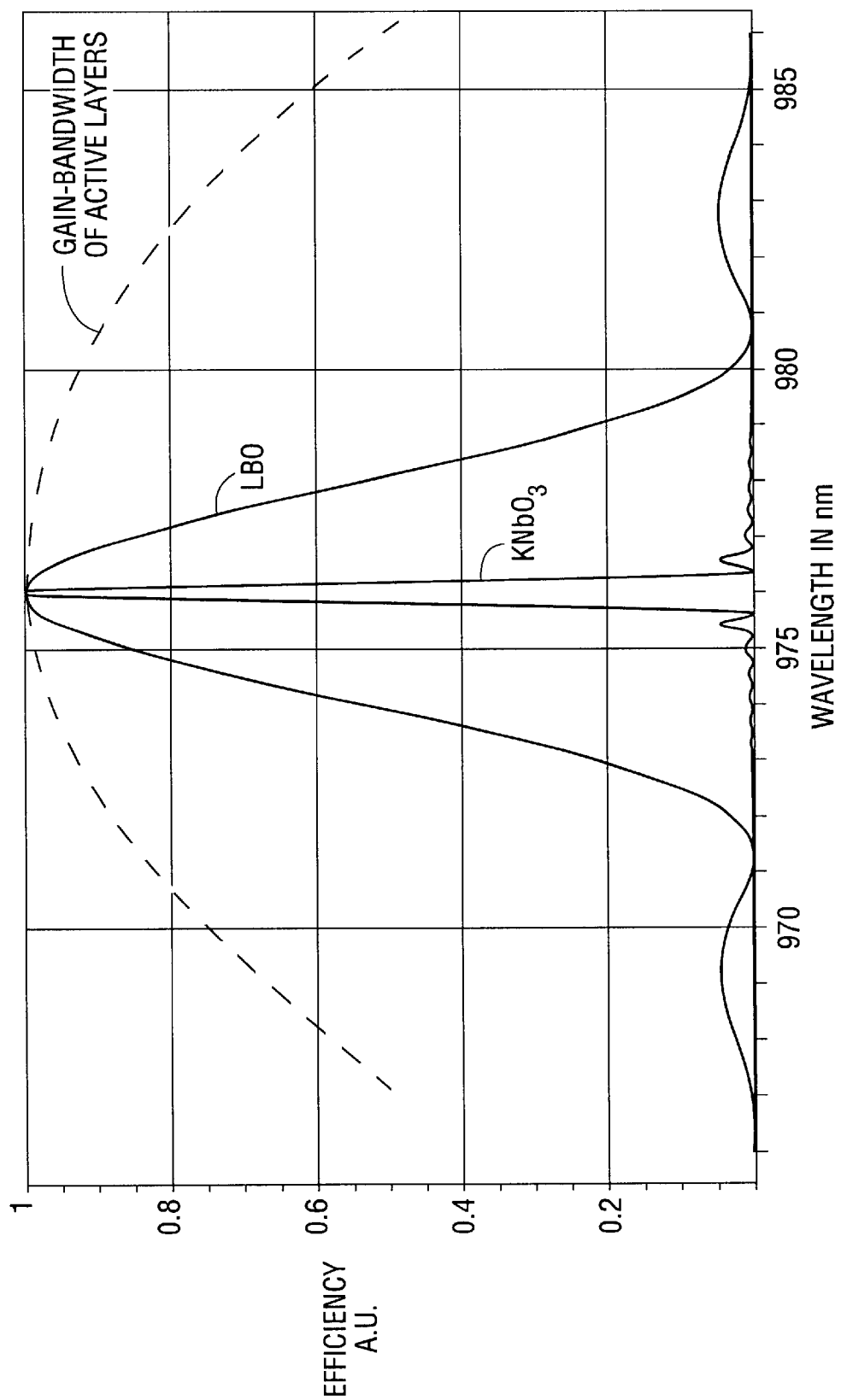
FIG. 12 is a graph schematically illustrating computed conversion efficiency as a function of wavelength for LBO and potassium niobate ($KNbO_3$) crystals of equal-length.

FIG. 12 depicts the computed, normalized spectral-acceptance of $KNbO_3$, and of the significantly-more-durable, but less efficient, LBO. Each is assumed to be in the form of a 5 mm-long crystal. Also depicted is the gain-bandwidth of active layers of InGaAs having a composition selected to provide laser action around 976 nm. It can be seen that the spectral-acceptance of the $KNbO_3$ is about one-tenth that of the LBO, and is very narrow by comparison with the gain-bandwidth of the active layers.

Now, as the frequency-doubling mechanism of an intra-cavity optically-nonlinear crystal represents a loss for the fundamental-wavelength, absent any other constraint, the resonator will tend to shift (hop) its oscillation wavelength to a wavelength where there is no loss. When this happens, frequency-doubled output will drop catastrophically, if not cease altogether, and fundamental power will surge correspondingly.

Wavelength-hopping will result in a very noisy frequency-converted output of lower average power than would be the case in the absence of wavelength-hopping. This wavelength-hopping can be limited by including in the resonator a highly wavelength-selective element such as a birefringent filter, an etalon, or the like. Any such device having the necessary selectivity, however, would introduce significant resonator losses, thereby limiting output-power.

Either way, this would mean that the nominally high conversion-efficiency of the $KNbO_3$ may not be realized, in practice, in its full measure. Further, the wavelength-selective device would probably require an active measure such as temperature control to satisfactorily stabilize its peak-transmission wavelength.

The LBO material, having the much wider acceptance would still not be completely immune from wavelength-hopping, without the wavelength-restraining benefit of an intracavity wavelength-selective device. Such a wavelength-selective device in the case of LBO, however, can be ten-times less selective than would be required for the $KNbO_3$; would not require active stabilization; and would not introduce significant cavity losses.

For completeness, it is pointed out here that the spectral-acceptance of an optically-nonlinear crystal is inversely proportional to the length of the crystal. The second-harmonic-generating (SHG) efficiency of such a crystal is roughly proportional to the square of a material constant $d_{eff}$, multiplied by the square of the length of the crystal. As the value of $d_{eff}$ for $KNbO_3$ is about ten-times greater than the value of $d_{eff}$ for LBO, then, in theory at least, a 0.5 mm-long $KNbO_3$ crystal would have the same peak SHG-efficiency and spectral-acceptance as a 5.0 mm-long LBO crystal. It is believed, however, that because of the fragility of the KNbO3, a 0.5 mm long KNbO3 crystal may be somewhat impractical to fabricate and handle. The use of KNbO3 crystals in resonators in OPS-laser resonators in accordance with the present invention, however, is not precluded.

Generally, for reasons discussed, above LBO and chromium lithium triborate (CLBO) are preferred for frequency-doubling and, alternatively, for frequency tripling. BBO is preferred for frequency quadrupling and, alternatively, for frequency tripling. For doubling or tripling wavelengths shorter than about 670 nm, optically nonlinear materials including strontium barium borate (SBBO), strontium borate (SBO), and barium zinc borate (BZBO) are believed to be effective. These optically-nonlinear material preferences should not, however, be considered as limiting IC frequency-converted lasers in accordance with the present invention.

TABLE 1

| Bragg Mirror | QW/Separator | Substrate | Fundamental Wavelength (nm) |
|---|---|---|---|
| 1 | $In_xGa_{1-x}As/GaAs_yP_{1-y}$ | GaAs | 900–1050 |
| 2 | $In_xGa_{1-x}P/In_yGa_{1-y}As_zP_{1-z}$ | GaAs | 700–900 |
| 3 | $InAs_xP_{1-x}/InGa_yP_{1-y}$ | InP | 930–1800 |

TABLE 2

| | Bragg Mirror Materials | |
|---|---|---|
| Structure Number | High Refractive-Index Layers | Low Refractive-Index Layers |
| 1 | GaAs | $AlAs_xP_{1-x}$ |
| 2 | $In_xAl_{1-x}P$ | $Al_yGa_{1-y}As$ |
| 3 | Dielectric | Dielectric |

Continuing now with a description of preferred materials for high-power OPS-structures in accordance with the present invention, TABLE 1 lists preferred QW layer and separator-layer materials for gain-structure 30. Each set of materials is associated with a particular mirror-structure 30

(Bragg mirror) number, substrate and fundamental-wavelength range. Details of Bragg mirror, composition are given in TABLE 2.

The structures represented in TABLES 1 and 2 represent a departure from prior-art-preferred structures for the same wavelength ranges, in regard to both mirror-structures and gain-structures. In TABLES 1 and 2 compound composition proportions (subscripts) x, y, and z all have a value between 0.0 and 1.0. In each case, materials (compounds) are selected such that the stress of the OPS-structure as a whole is as low as practically possible, by ensuring that the stress-thickness product of all tensile strained layers and all compressive strained layers is about of equal magnitude. This is of particular importance in OPS-structures in accordance with the present invention which are subject to the stress of high operating temperatures, and correspondingly large temperature-cycles between periods of operation and inactivity.

The OPS-structure (see FIG. 2) of the above-exemplified IC frequency-doubled OPS-laser in accordance with the present invention is an example of the first-listed family of structures wherein GaAs "transition" layers between the QW and separator layers, alleviate the stress-difference which would otherwise exist between these layers. The gain-structure of the OPS-structure of FIG. 2 can be generally categorized as being formed from components of the III-V quaternary system InGaAsP wherein the substrate material is a binary III-V compound of the components (here GaAs), and wherein the QW layers are formed from a one possible ternary III-V compound including both components of the substrate material, and the separator layers are formed from the other possible ternary III-V compound including both components of the substrate material. Type 3 structures of TABLE 1 (on InP substrate material) also fall into this category. This is believed to provide the optimum stress compensation for OPS structures formed from this quaternary system. For type 3 structures of Table 1 a mirror-structure including dielectric materials is preferable. One preferred structure includes high refractive index layers of zinc selenide (ZnSe) and low refractive index layers of aluminum oxide. This combination provides about the same reflectivity per number of layer-pairs as the combination of $TiO_2$ and $SiO_2$ used in general coating applications in the prior-art, but with a lower total physical thickness and higher thermal conductivity. It is emphasized here that the mirror structures of TABLE 2 are preferred structures for use with QW/separator structures of TABLE 1, the use of other mirror structures with the QW/separator structures of TABLE 1 in OPS-lasers in accordance with the present invention is not precluded.

Further, from the description of inventive OPS-lasers provided above, those skilled in the art may select other OPS-structures for providing fundamental-radiation at wavelengths between about 425 nm and 1800 nm without departing from the spirit and scope of the present invention. Such structures may include, by way of example, QW or active layers selected from a group of semiconductor compounds consisting of, $In_xGa_{1-x}As_yP_{1-y}$, $Al_xGa_{1-x}As_yP_{1-y}$, and $In_xGa_{1-x}N$ where $0.0 \leq x \leq 1.0$ and $0 \leq y \leq 1$. This list, however, should not be considered as limiting the present invention. Second, third and fourth harmonic wavelengths, of course, would be between about 212 and 900 nm; 142 and 600 nm; and 106 and 225 nm. Performance in the shorter wavelength half of the latter range may be somewhat limited by the availability of suitable optical materials.

Turning next to a discussion of further aspects of increasing output-power in OPS-lasers in the present invention, in embodiments of OPS-lasers described above, only one OPS-structure 32 is included. Several approaches to increasing output-power to beyond the levels achieved or confidently predicted have been discussed without regard to this. It will be evident to one skilled in the art from these discussions, however, that exploiting the above-discussed approaches alone may lead to a point of diminishing returns. Should this prove to be the case, or simply as an alternative, output-power (fundamental or harmonic) may be increased by incorporating at least a second OPS-structure in a suitably-configured resonator. A description of one such resonator is set forth below.

Figure 13:
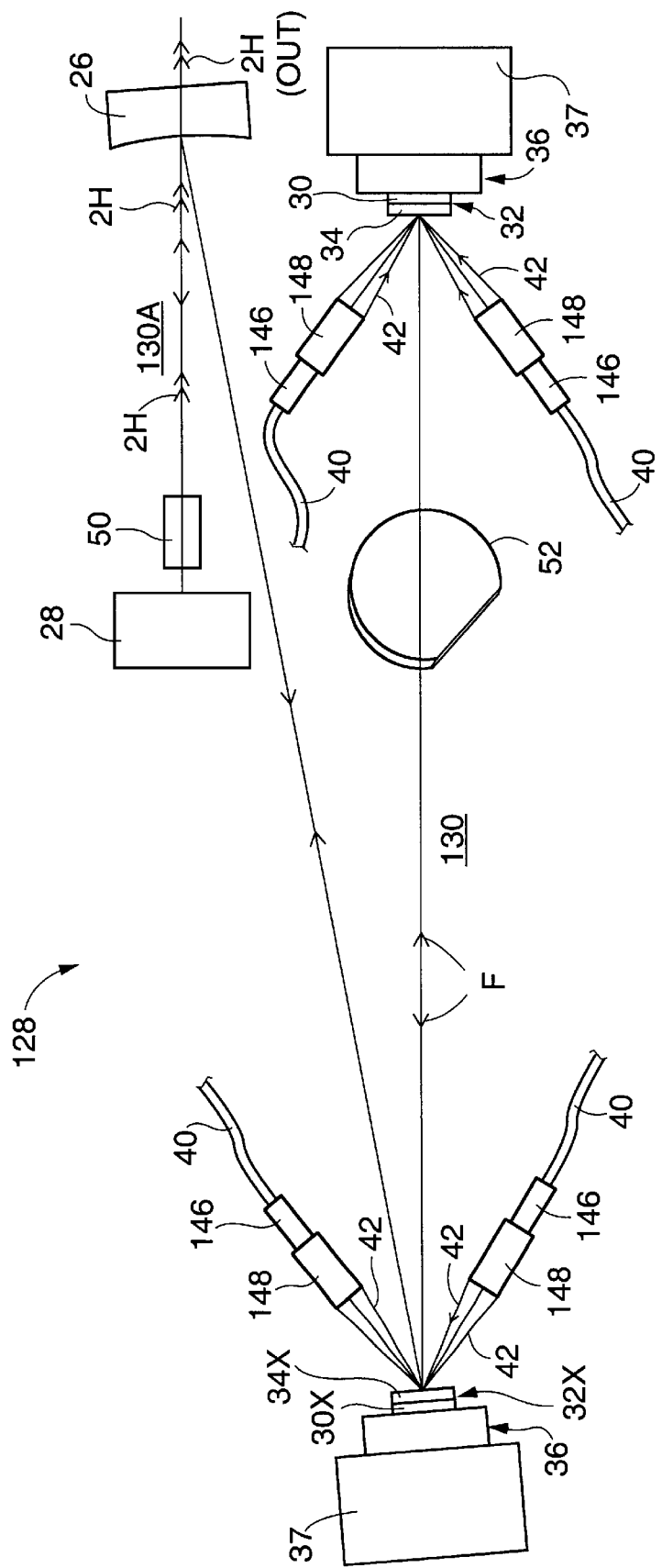
FIG. 13 schematically illustrates a further preferred embodiment of an OPS-laser in accordance with the present invention having a resonator including two OPS-structures and an optically-nonlinear crystal arranged for intracavity frequency-doubling the fundamental-wavelength of the OPS-structure.

Referring to FIG. 13, a further embodiment 128 of an IC frequency-doubled OPS-laser in accordance with the present invention is depicted. Laser 128 comprises a tightly-folded resonator 130 including two OPS-structures, 32 and 32X. Resonator 130 is terminated at one end thereof by mirror-structure 30 of OPS-structure 32 and at the other end thereof by a mirror 28. Resonator 130 includes a birefringent filter 52 for reasons discussed above. The OPS-structures are mounted on above-described heat-sink assemblies 36. Resonator axis 132 is folded once by mirror-structure 30X of OPS-structure 32X, and again by a fold-mirror 26. An optically-nonlinear crystal 50, arranged for frequency-doubling, is located in arm 130A of resonator 130, i.e., between fold-mirror 26 and end mirror 28. Mirror 28 is coated for maximum reflectivity at the fundamental-wavelength. Mirror 26 is coated for maximum reflectivity at the fundamental-wavelength and maximum transmission at the 2H-wavelength.

It should be noted here that the tight folding of the resonator is selected to maintain as close to normal incidence as possible on OPS-structure 32X. This is to minimize interference in gain structure 34X between counterpropagating fundamental beams. Such interference can lead to the formation of interference-fringes (a sort of "lateral spatial hole-burning") in the plane of the QW layers, thereby limiting gain extraction from these layers. In this regard, it is also preferable to adjust spacing of the QW layers in gain-structure 34X and the thickness of layers of mirror-structure 30X to compensate for the effective refractive index change due to non-normal incidence, thereby maintaining effective half-wavelength spacing of the QW layers.

Continuing with reference to FIG. 13, a further difference between laser 128 and other above described OPS-lasers in accordance with the present invention is the manner in which pump-light is delivered to the OPS-structures. In laser 128, pump-light is transported along fibers 40 as in other above-described embodiments. Fold-mirror 44 and focusing-lenses 46 and 48 of these other embodiments, however, are replaced with an assembly of two radial-gradient-index lenses 146 and 148. Such lenses are often referred to generically as "selfoc". It has been found such lenses can provide the same optical performance as lenses 46 and 48 in the above-described example of laser 20. In one example lens 146 is a Part No. 06LGS216 available from Melles Griot Inc of Irvine Calif. Lens 148 is a Part No. SLW180-020-083-A2. This selfoc lens arrangement provides convenient access for multi-fiber (fiber-bundle) pumping in the case of tightly-folded resonators such as resonator 28. The arrangement may be used in any other above-described embodiment simply to reduce the volume of pump-light delivery optics or to permit power to be delivered by more fibers than would be possible because of the bulk of the conventional focusing-optics.

From the foregoing description, those skilled in the art to which the present invention pertains may devise OPS-lasers including more than two OPS-structures without departing from the spirit and scope of the present invention. Such OPS-lasers may be configured for delivering output-radiation at the fundamental wavelength of the OPS-structures or at harmonic wavelengths thereof.

Figure 14:
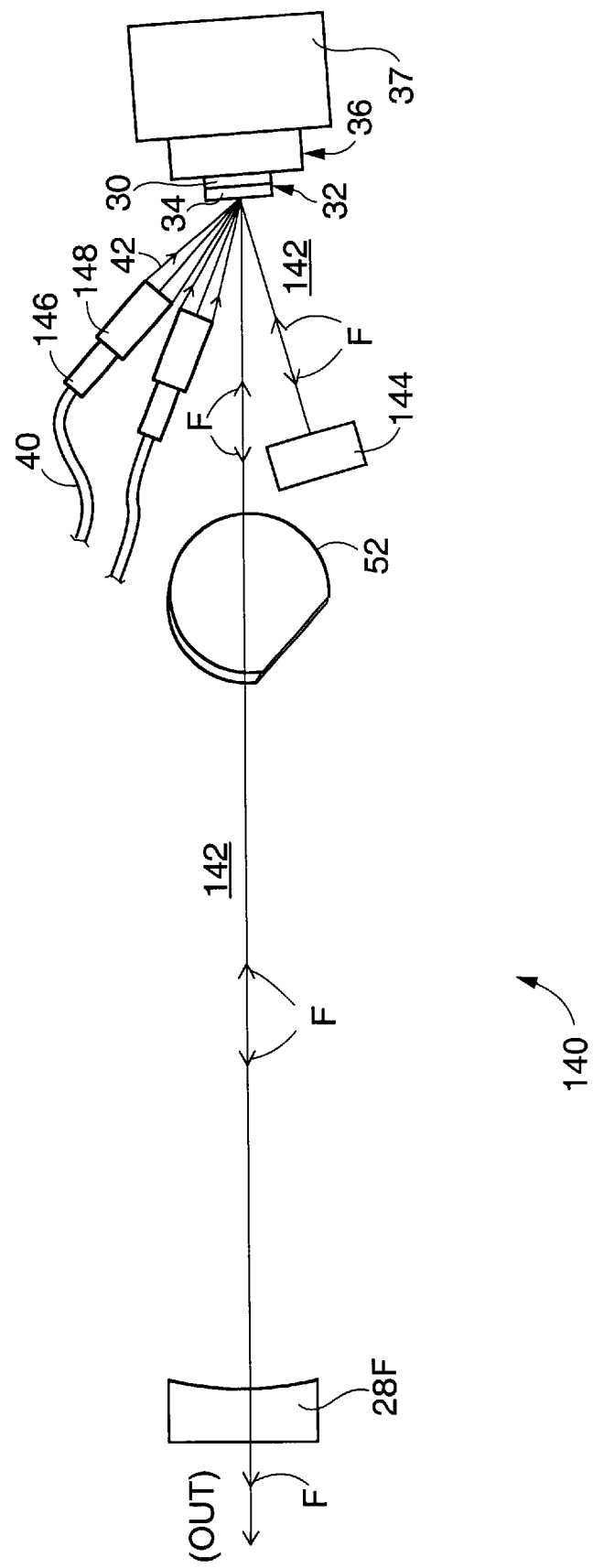
FIG. 14 schematically illustrates a further preferred embodiment of an OPS-laser in accordance with the present invention having a folded resonator terminated by first and second external mirrors and being folded by a mirror-structure of an OPS-structure.

From the description of laser 128 it will also be evident to those skilled in the art that a folded laser-resonator may be formed between two external mirrors, and include one or more OPS-structures 32 only as fold mirrors. Such a folded laser-resonator is depicted in FIG. 14. Here, an OPS-laser 140 in accordance with the present invention includes a laser-resonator 142 terminated by mirrors 28F and 144 and tightly-folded (for reasons discussed above) by mirror structure 30 of OPS-structure 32. Heat-sink and optical-pumping arrangements are the same as described above for laser 128. Laser resonator optionally includes a birefringent filter 52.

The laser-resonator arrangement of laser 140 may be useful if it desired to configure a laser-resonator which is terminated by two non-flat mirrors. It will be evident from the arrangement of laser 140 that similar arrangements wherein a resonator is not terminated at one end thereof by a mirror-structure of an OPS-structure may be devised for any other above described embodiments of OPS-lasers in accordance with the present invention.

In summary, several embodiments of high-power, IC frequency-converted, OPS-lasers in the accordance with the present invention have been described above. Generally, embodiments of the inventive laser can generate second, third or fourth harmonic output-power from fundamental radiation at a power of 100 mW or greater, and even at 1 W or greater. These high-harmonic output powers can be achieved in single axial mode or TEM$_{00}$ operation with a beam-quality of less than about twice the diffraction-limit. Particularly notable is the ability of the inventive lasers to generate UV output-radiation at these high output-powers, more particularly, at better than one percent pump-to-harmonic efficiency by second-harmonic generation from fundamental radiation in a 700 nm to 800 nm wavelength ranges.

The inventive OPS-lasers, can provide a means of generating wavelengths, in a true CW mode of operation, which can closely match the optimum wavelength for many laser applications, in fields such as medicine, optical metrology, spectroscopy, optical lithography, and precision laser machining. By way of example, an inventive OPS laser can efficiently produce CW output radiation in the 590 to 600 nm wavelength range by second-harmonic generation from an OPS-structure emitting in the 1180 to 1200 nm range. 590 to 600 nm is advantageous for ophthalmic surgical application. This wavelength range can not be efficiently generated by prior-art lasers. The ability to generate high-power UV radiation is applicable in particular in areas such as direct writing or patterning of printed circuit boards or conventional UV plates. In such applications the inventive OPS-lasers offer not only power, efficiency and beam quality, but also the ability for many applications to "tailor" an output wavelength to an absorption-peak of material to be exposed, cut, ablated, heated, photochemically altered or otherwise treated, thereby reducing the absolute power required for the applications. From the above presented description of the OPS lasers those skilled in the appropriate arts may conceive many other uses for the inventive lasers without departing from the spirit and scope of the present invention.

The present invention is described and depicted herein with reference to a preferred and other embodiments. The present invention is not restricted, however, to those embodiments described and depicted. Rather, the invention is limited only by the claims appended hereto.

What is claimed is:

1. A laser, comprising:

an OPS-structure having a gain-structure surmounting a mirror-structure, said gain-structure including a plurality of active layers having pump-light-absorbing layers therebetween, said active layers having a composition selected to provide emission of electromagnetic radiation at a predetermined fundamental-wavelength between about 425 nanometers and 1800 nanometers when optical-pump light is incident on said gain-structure, and said mirror-structure including a plurality of layers of alternating high and low refractive index and having an optical thickness of about one-quarter wavelength of said predetermined wavelength;

a laser-resonator formed between said mirror-structure of said OPS-structure and a reflector spaced apart therefrom, said laser resonator having a longitudinal axis;

an optical arrangement for delivering said pump-light to said gain-structure, thereby causing fundamental laser-radiation having said fundamental-wavelength to oscillate in said laser-resonator;

a heat-sink arrangement for cooling said OPS-structure;

an optically-nonlinear crystal located in said laser-resonator and arranged for frequency-doubling said fundamental laser-radiation thereby providing frequency-doubled radiation having a wavelength half of said fundamental-wavelength; and said laser-resonator, said optically nonlinear-crystal, said OPS-structure, said heat-sink arrangement and said optical pump-light-delivering arrangement selected and arranged such that said resonator delivers said frequency-doubled radiation as output-radiation having a wavelength between about 212 nanometers and 900 nanometers at an output-power greater than about 100 milliwatts.

2. The laser of claim 1, wherein said optically nonlinear-crystal, said OPS-structure and said optical pump-light-delivering arrangement selected and arranged such that said resonator delivers said frequency-doubled radiation as output-radiation having an output-power greater than about 1 Watt.

3. The laser of claim 1 wherein said laser-resonator has an optical length of at least about 5 cm.

4. The laser of claim 1, wherein said frequency-doubled radiation is delivered in a single axial-mode.

5. The laser of claim 1 wherein, said active layers of said gain structure are selected from the group of semiconductor compounds consisting of $In_xGa_{1-x}As_yP_{1-y}$, $Al_xGa_{1-x}As_yP_{1-y}$, and $In_xGa_{1-x}N$ where $0.0 \leq x \leq 1.0$ and $0 \leq y \leq 1$.

6. The laser of claim 5 wherein, said active layers of said gain structure have a composition of $In_xGa_{1-x}As$ where $0.0 < x < 1.0$ and x is selected such that said fundamental wavelength is between about 900 and 1050 nanometers, and said gain structure includes separator layers between said active layers, said separator layers having a composition $GaAs_yP_{1-y}$.

7. The laser of claim 6 wherein, said high refractive index layers of said mirror-structure have a composition GaAs and said low refractive index layers of said mirror-structure have a composition $AlAs_yP_{1-y}$ where $0.0 < y < 1.0$.

8. The laser of claim 5 wherein, said active layers of said gain structure have a composition of $In_xGa_{1-x}P$ where $0.0 < x < 1.0$ and x is selected such that said fundamental wavelength is between about 700 and 900 nanometers, and said gain structure includes separator layers between said active layers said separator layers having a composition $In_yGa_{1-y}As_zP_{1-z}$ where 0.0<y<1.0 and 0.0<z<1.0.

9. The laser of claim 8 wherein, said high refractive index layers of said mirror-structure have a composition $In_pAl_{1-p}P$, 0.0<p<1.0, and said low refractive index layers of said mirror-structure have a composition $Al_qGa_{1-q}As$, where 0.0<q<1.0.

10. The laser of claim 5 wherein, said active layers of said gain structure have a composition of $In_xAs_{1-x}P$ where 0.0<x<1.0 and x is selected such that said fundamental wavelength is between about 700 and 900 nanometers, and said gain structure includes separator layers between said active layers said separator layers having a composition $Al_yGa_{1-y}As$ where 0.0<y<1.0.

11. The laser of claim 10, wherein said high refractive index layers and said low refractive index layers of said mirror-structure are layers of respectively high and low refractive dielectric materials transparent to said fundamental wavelength.

12. The laser of claim 11, wherein said high refractive index material is zinc selenide and said low refractive index material is aluminum oxide.

13. The a laser of claim 1, wherein said active layers of said gain-structure have a gain-bandwidth, said optically nonlinear crystal has a spectral acceptance-range for frequency-doubling, said spectral-acceptance range being less than said gain bandwidth, and said laser resonator further includes a wavelength-selective element configured and arranged to prevent fundamental laser-radiation having a wavelength outside of said spectral-acceptance range from oscillating in said laser resonator.

14. The laser of claim 13, wherein said wavelength-selective element is a birefringent filter.

15. The laser of claim 13, wherein said wavelength-selective element is an etalon.

16. The laser of claim 1, wherein said heat-sink arrangement includes an actively-cooled member and said actively-cooled member has a diamond layer in thermal contact therewith, said mirror-structure of said OPS-structure OPS structure being in thermal contact with said diamond layer.

17. The laser of claim 16, wherein said actively-cooled member is a microchannel-cooler.

18. The laser of claim 1 wherein said optical arrangement for delivering said pump-light to said gain-structure includes at least one optical-lightguide for transporting pump-light from a source thereof to an optical-focusing arrangement for focusing said pump-light, said optical-focusing including at least one lens.

19. The laser of claim 18 wherein said at least one lens is a radial-gradient-index lens.

20. The laser of claim 19 wherein said optical-focusing arrangement includes two radial-gradient-index lenses.

21. The laser of claim 1 wherein said optically-nonlinear-crystal is one of an LBO crystal and a CLBO crystal.

22. The laser of claim 1 wherein said optically-nonlinear crystal is a crystal of a material selected from the group of optically-nonlinear materials consisting of LBO, CLBO, BBO, SBBO, SBO, and BZBO.

23. The laser of claim 1 wherein said longitudinal-axis of said laser-resonator is folded at an angle by a fold-mirror located between said reflector and said OPS-structure, and said optically-nonlinear crystal is located on said longitudinal-axis of said laser-resonator between said reflector and said fold-mirror.

24. The laser of claim 23 wherein said fold-mirror is highly reflective for said fundamental-radiation and highly transmissive for said frequency-doubled radiation, said fold-mirror thereby serving as an output-coupling mirror for delivering said frequency-doubled output-radiation from said laser-resonator and essentially preventing frequency-doubled radiation from reaching said OPS-structure.

25. The laser of claim 24 wherein said fold mirror is convex for focusing the light into the optically-nonlinear crystal.

26. The laser of claim 1 wherein said OPS-structure is configured to minimize parasitic lateral oscillation of fundamental radiation therein.

27. The laser of claim 26, wherein said OPS-structure is in the form of a rectangular chip having an emitting-face, said pump-light being delivered onto said emitting-face in a predetermined area thereon, said chip having two pairs of parallel end-faces at right angles to said emitting-face, said parallel end faces being spaced apart by a distance at least three times the longest dimension of said predetermined pump-light-delivery area to minimize parasitic lateral oscillation of fundamental radiation therein.

28. The laser of claim 26, wherein said OPS-structure is in the form of a rectangular chip having an emitting-face and having two pairs of parallel end-faces at right angles to said emitting-face, said parallel end-faces being roughened to prevent spectral reflection of fundamental radiation therefrom, thereby minimizing said parasitic lateral oscillation.

29. The laser of claim 1, wherein, in said mirror-structure, the refractive index, thermal conductivity, and number of said layers thereof are selected to provide maximum thermal conductivity of heat-generated in said gain-structure to said heat-sink arrangement, while providing sufficient reflectivity to cause build-up of fundamental radiation in said laser resonator.

30. The laser of claim 1, wherein said mirror-structure further includes a layer of a highly-reflective metal, said metal-layer being closest to said heat-sink arrangement.

31. The laser of claim 1, wherein said pump-light is delivered on said gain-structure of said OPS-structure in a predetermined pump spot-size and said resonator is configured such that the spot-size at said gain structure of said oscillating fundamental laser-radiation is about equal to said pump spot-size.

32. The laser of claim 31, said frequency-doubled output radiation is delivered in a single axial-mode.

33. The laser of claim 32 wherein said fold-mirror is highly reflective for said fundamental-radiation and highly transmissive for said frequency-doubled radiation and said frequency-tripled radiation, said fold mirror thereby serving as an output-coupling mirror for delivering said frequency-tripled output-radiation from said laser-resonator and essentially preventing frequency-doubled and frequency tripled radiation from reaching said OPS-structure.

34. A laser, comprising:
an OPS-structure having a gain-structure surmounting a mirror-structure, said gain-structure including a plurality of active layers having pump-light-absorbing layers therebetween, said active layers having a composition selected to provide emission of electromagnetic radiation at a predetermined fundamental-wavelength between about 425 nanometers and 1800 nanometers when optical-pump light is incident on said gain-structure, and said mirror-structure including a plurality of layers of alternating high and low refractive index and having an optical thickness of about one-quarter wavelength of said predetermined wavelength;
a laser-resonator formed between said mirror-structure of said OPS-structure and a reflector spaced apart therefrom, said laser resonator having a longitudinal axis;

an optical arrangement for delivering said pump-light to said gain-structure, thereby causing fundamental laser-radiation having said fundamental-wavelength to oscillate in said laser-resonator;

a heat-sink arrangement for cooling said first OPS-structure;

a first optically-nonlinear crystal located in said laser-resonator and arranged for frequency-doubling said fundamental laser-radiation, thereby providing frequency-doubled radiation having a wavelength half of said fundamental wavelength;

a second optically-nonlinear crystal located in said laser-resonator an arranged for mixing said frequency-doubled radiation and said fundamental laser-radiation thereby providing frequency-tripled radiation having a wavelength one-third of said fundamental-wavelength; and said laser-resonator, said optically nonlinear-crystal, said OPS-structure, said heat-sink arrangement and said optical pump-light-delivering arrangement selected and arranged such that said resonator delivers said frequency-tripled radiation as output-radiation having a wavelength between about 142 nanometers and 600 nanometers at an output-power greater than about 100 milliwatts.

35. The laser of claim 34 wherein said longitudinal-axis of said laser-resonator if folded at an angle by a fold-mirror located between said reflector and said OPS-structure, and said first and second optically-nonlinear crystals are located on said longitudinal-axis of said laser-resonator between said reflector and said fold-mirror.

36. The laser of claim 33, wherein said first optically-nonlinear crystal is a crystal of a material selected from the group of optically-nonlinear materials consisting of LBO, and CLBO.

37. The laser of claim 33 wherein said second optically-nonlinear crystal is a crystal of a material selected from the group of optically-nonlinear materials consisting of LBO, CLBO, BBO, SBBO, SBO, and BZBO.

38. A laser, comprising:

a laser-resonator having a resonator axis and being terminated by first and second mirrors;

an OPS-structure having a surface-emitting gain-structure, said gain-structure including a plurality of active layers having separator layers therebetween said active layers having a composition selected to provide emission of electromagnetic radiation at a predetermined fundamental-wavelength when optical-pump light is incident on said gain-structure, and said laser-resonator being configured to include said gain-structure of said OPS-structure;

an optical arrangement for delivering said pump-light to said gain-structure, thereby causing fundamental laser-radiation having said fundamental-wavelength to oscillate in said laser-resonator;

a heat-sink arrangement for cooling said OPS-structure;

an optically-nonlinear crystal located in said laser-resonator and arranged for frequency-doubling said fundamental laser-radiation thereby providing frequency-doubled radiation having a wavelength half of said fundamental-wavelength; and said laser-resonator, said optically nonlinear crystal, said heat-sink arrangement and said optical pump-light-delivering arrangement selected and arranged such that said resonator delivers said frequency-doubled radiation as output-radiation at an output-power greater than about 100 milliwatts.

39. A laser as recited in claim 38 wherein said OPS structure surmounts a mirror structure, and wherein said mirror structure functions as a fold mirror in the laser resonator.

40. A laser, comprising:

an OPS-structure having a gain-structure surmounting a mirror-structure, said gain-structure including a plurality of active layers having pump-light-absorbing layers therebetween, said active layers having a composition selected to provide emission of electromagnetic radiation at a predetermined fundamental-wavelength when optical-pump light is incident on said gain-structure, and said mirror-structure including a plurality of layers of alternating high and low refractive index and having an optical thickness of about one-quarter wavelength of said predetermined wavelength;

a laser-resonator formed between said mirror-structure of said OPS-structure and a reflector spaced apart therefrom, said laser resonator having a longitudinal axis, said longitudinal axis being folded by a fold-mirror located thereon between said OPS-structure and said reflector;

an optical arrangement for delivering said pump-light to said gain-structure, thereby causing fundamental laser-radiation having said fundamental-wavelength to oscillate in said laser-resonator; and a first optically-nonlinear crystal located in said laser-resonator between said fold-mirror and said reflector said fold-mirror being configured to focus said oscillating fundamental radiation into said optically-nonlinear crystal, said optically-nonlinear crystal being arranged for frequency-doubling said fundamental laser-radiation thereby generating frequency-doubled radiation having a wavelength half of said fundamental-wavelength.

41. The laser of claim 40, further including a heat-sink arrangement for cooling said OPS-structure, and wherein said laser-resonator, said optically nonlinear-crystal, said OPS-structure, said heat-sink arrangement and said optical pump-light-delivering arrangement selected and arranged such that said resonator delivers said frequency-doubled radiation as output-radiation at an output-power greater than about 100 milliwatts.

42. The laser of claim 40, wherein said fold-mirror is highly reflective for said fundamental laser-radiation and highly transmissive for said frequency-doubled radiation, whereby said frequency-doubled radiation exits said resonator as output radiation.

43. The laser of claim 40, wherein said composition of said active layers of said gain-structure is selected such that said fundamental-wavelength is between about 425 nm and 1800 nm, said frequency-doubled radiation correspondingly having a wavelength between about 212 and 900 nm.

44. The laser of claim 40, further including a second optically-nonlinear crystal located in said laser-resonator an arranged for mixing said frequency-doubled radiation and said fundamental laser-radiation thereby providing frequency-tripled radiation having a wavelength one-third of said fundamental-wavelength.

\* \* \* \* \*